(12) United States Patent
Oyu et al.

(10) Patent No.: US 7,911,058 B2
(45) Date of Patent: Mar. 22, 2011

(54) SEMICONDUCTOR CHIP HAVING ISLAND DISPERSION STRUCTURE AND METHOD FOR MANUFACTURING THE SAME

(75) Inventors: Kiyonori Oyu, Tokyo (JP); Shigeru Aoki, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 803 days.

(21) Appl. No.: 11/599,268

(22) Filed: Nov. 15, 2006

(65) Prior Publication Data

US 2007/0120255 A1    May 31, 2007

(30) Foreign Application Priority Data

Nov. 30, 2005  (JP) ................................. 2005-345056

(51) Int. Cl.
*H01L 23/24* (2006.01)
(52) U.S. Cl. .................. 257/750; 257/E23.01
(58) Field of Classification Search .................. 257/763, 257/774, 758, E23.01, 750, 734, 737, 738, 257/779–781, 786

See application file for complete search history.

(56) References Cited

U.S. PATENT DOCUMENTS

| 6,248,664 | B1 | 6/2001 | Saha et al. | |
|---|---|---|---|---|
| 7,183,172 | B2 | 2/2007 | Lee et al. | |
| 2002/0197836 | A1* | 12/2002 | Iyer et al. | 438/585 |
| 2003/0218212 | A1 | 11/2003 | Lee et al. | |
| 2004/1012692 | | 7/2004 | Ko et al. | |
| 2005/0181572 | A1* | 8/2005 | Verhoeven et al. | 438/379 |
| 2007/0117300 | A1 | 5/2007 | Lee et al. | |
| 2008/0280140 | A1* | 11/2008 | Ferrari et al. | 428/402 |

FOREIGN PATENT DOCUMENTS

| JP | 60-148128 | | 8/1985 |
|---|---|---|---|
| JP | 8-213292 | | 8/1996 |
| JP | 9-223782 | A | 8/1997 |
| JP | 10-335632 | A | 12/1998 |
| JP | 2000-353797 | | 12/2000 |
| JP | 3250721 | | 11/2001 |
| JP | 2001-358154 | | 12/2001 |
| JP | 2002-344012 | | 11/2002 |
| JP | 2003-347525 | | 12/2003 |
| JP | 2004-214598 | A | 7/2004 |
| JP | 2004-266070 | | 9/2004 |

(Continued)

OTHER PUBLICATIONS

Taiwanese Office Action, w/ English translation thereof, issued in Taiwanese Patent Application No. TW 09820393810 dated Jun. 29, 2009.

(Continued)

*Primary Examiner* — N Drew Richards
*Assistant Examiner* — Hoa B Trinh
(74) *Attorney, Agent, or Firm* — McDermott Will & Emery LLP

(57) ABSTRACT

The present invention has an object to provide a semiconductor chip of high reliability with less risk of breakage. Specifically, the present invention provides a semiconductor chip having a semiconductor silicon substrate including a semiconductor device layer and a porous silicon domain layer, the semiconductor device layer being provided in a main surface region on one surface of the semiconductor silicon substrate, the porous silicon domain layer being provided in a main surface region on a back surface which is the other surface of the semiconductor silicon substrate, and the porous silicon domain layer having porous silicon domains dispersed like islands in the back surface of the semiconductor silicon substrate.

5 Claims, 14 Drawing Sheets

FOREIGN PATENT DOCUMENTS

| | | |
|---|---|---|
| JP | 2004-266071 | 9/2004 |
| JP | 2005-005321 A | 1/2005 |
| JP | 2005-251939 A | 9/2005 |
| JP | 4290038 | 4/2009 |
| JP | 4347960 | 7/2009 |
| JP | 4371710 | 9/2009 |
| KR | 10-2002-0042215 | 5/2002 |
| KR | 10-2003-0090881 | 12/2003 |
| TW | 420827 | 2/2001 |
| TW | 085115259 | 2/2001 |
| TW | 490752 | 6/2002 |
| TW | I230398 | 4/2005 |
| TW | 093115344 | 10/2005 |
| TW | I242232 | 10/2005 |
| WO | WO 02/45146 A1 | 6/2002 |

OTHER PUBLICATIONS

Taiwanese Office Action, w/ English translation thereof, issued in Taiwanese Patent Application No. TW 095144130 dated Feb. 22, 2010.

Japanese Notice of Reasons for Rejection, with partial English Translation, issued in Japanese Patent Application No. 2005-345056, dated Jun. 9, 2010.

Chinese Office Action, with English translation, issued in Chinese Patent Application No. CN 200610163133.6, mailed Mar. 21, 2008.

Shiyang, Z., et al., "Copper Gettering by Backside Porous Silicon in SIMOX Wafers", Nov. 1998, pp. 420-424, vol. 18 No. 4, Research & Progress of SSE.

Korean Office Action, with Japanese translation and Partial English Translation, issued in Korean Patent Application No. KR 10-2006-0119959 dated on Jul. 25, 2008.

* cited by examiner

100nm

SEMICONDUCTOR CHIP HAVING ISLAND DISPERSION STRUCTURE AND METHOD FOR MANUFACTURING THE SAME

BACKGROUND OF THE INVENTION

1. Field of the Invention

The present invention relates to a semiconductor chip having an island dispersion structure on the back surface of the semiconductor silicon substrate and a method for manufacturing the same.

2. Description of the Related Art

When a semiconductor silicon wafer is manufactured or worked on, there is sometimes a porous silicon layer deposited on the semiconductor silicon wafer.

As this porous silicon layer may get in the way of jointing of a plug in setting up the plug in a semiconductor chip obtained from the semiconductor silicon wafer, the porous silicon layer is removed during manufacturing and working on of the semiconductor silicon wafer. For this reason, the semiconductor chip usually has no porous single-crystal layer (See Japanese Patent Application Publication No. H10-335632).

However, for a semiconductor chip of extremely limited application, for example, photodiode, there is proposed a semiconductor chip having a porous silicon layer. This porous silicon layer has a property of converting light of short wavelength into visible light. In order to make effective use of this property, as an essential requirement for configuration the porous silicon layer is provided on the same side of the semiconductor chip as a semiconductor device layer (See Japanese Patent Application Publication No. 2004-214598).

BRIEF SUMMARY OF THE INVENTION

Meanwhile, as significant progress has been made in reduction in size and weight of electric or electronic devices, semiconductor devices are required to be further miniaturized. For this reason, it is required to reduce the thickness of each semiconductor chip mounted on the semiconductor devices.

However, if the thickness of the semiconductor chip is reduced, the semiconductor chip is more likely to be broken in assembling or after assembling of the semiconductor device and there often occur malfunctions of the semiconductor device after assembling of the semiconductor device.

Then, the present invention has an object to provide a semiconductor chip of high reliability with less risk of breakage and a method for manufacturing the same.

As a result of keen examination to overcome the aforementioned problem, the inventor(s) of the present invention have found that the above mentioned problem was overcome by a semiconductor chip having porous silicon domains formed like islands in a main surface region on a back surface opposed to a main surface region where the semiconductor device layer is formed.

The inventors also have found that the problem was overcome by a semiconductor chip having dimples formed like islands and completed the invention.

Specifically, the present invention provides:

[1] a semiconductor chip including a semiconductor silicon substrate having a semiconductor device layer and a porous silicon domain layer, said semiconductor device layer being provided in a main surface region on one surface of the semiconductor silicon substrate, said porous silicon domain layer being provided in a main surface region on a back surface which is another surface of the semiconductor silicon substrate, and said porous silicon domain layer having porous silicon domains dispersed like islands in the back surface of the semiconductor silicon substrate.

The present invention further provides:

[2] the semiconductor chip of the above item [1], in which the porous silicon domains appearing on the back surface of the semiconductor silicon substrate in said porous silicon domain layer have an average diameter ranging from 0.2 to 800 μm provided that a shape of each of the porous silicon domains is replaced with a circle of identical area.

The present invention further provides:

[3] the semiconductor chip of the above item [1] or [2], in which a total area of the porous silicon domains appearing on the back surface region of the semiconductor silicon substrate in said porous silicon domain layer ranges from 10% to 90% of an area of the back surface.

The present invention further provides:

[4] a semiconductor chip including a semiconductor silicon substrate having a semiconductor device layer and a dimple layer, said semiconductor device layer being provided in a main surface region on one surface of the semiconductor silicon substrate, said dimple layer being provided in a main surface region on a back surface which is another surface of the semiconductor silicon substrate, and said dimple layer having dimples dispersed like islands in the back surface of the semiconductor silicon substrate.

The present invention further provides:

[5] the semiconductor chip of the above item [4], in which the dimples appearing have an average diameter ranging from 0.2 to 800 μm provided that a shape of each of the dimples is replaced with a circle of identical area.

The present invention further provides:

[6] the semiconductor chip of the above item [4] or [5], in which a total area of the dimples ranges from 10% to 90% of an area of the back surface.

The present invention further provides:

[7] the semiconductor chip of any one of the above items [1] to [6], further including a porous silicon layer on the back surface.

The present invention further provides:

[8] a method for manufacturing a semiconductor chip having the steps of:

(1) forming a semiconductor device layer in a main surface region on one surface of a semiconductor silicon wafer;

(2) grinding a back surface which is another surface of the semiconductor silicon wafer up to a predetermined thickness;

(3) forming a porous silicon domain layer having porous silicon domains dispersed like islands in the back surface of the semiconductor silicon wafer; and (4) dicing a worked semiconductor wafer obtained through the steps (1) to (3), and the step (3) including bringing a mixed vapor of hydrofluoric acid and nitric acid into contact with the back surface of the semiconductor silicon wafer.

The present invention further provides:

[9] the method of the above item [8], further comprising, between the steps (3) and (4), the step of (5) removing porous silicon domains from the porous silicon domain layer.

The present invention further provides:

[10] the method of the above item [8], further comprising, between the steps (3) and (4), the step of forming a porous silicon layer on the back surface of the semiconductor silicon wafer.

The present invention further provides:

[11] the method of the above item [9], further comprising, between the steps (5) and (4), the step of forming a porous silicon layer on the back surface of the semiconductor silicon wafer.

The present invention further provides:

[12] a method of manufacturing a semiconductor ship comprising the steps of:

(i) forming a semiconductor device layer in a main surface region on one surface of a semiconductor silicon wafer;
(ii) grinding a back surface which is another surface of the semiconductor silicon wafer up to a predetermined thickness;
(iii) forming a dimple layer having dimples dispersed like islands in the back surface of the semiconductor silicon wafer; and
(iv) dicing a worked semiconductor wafer obtained through the steps (i) to (iii), and
the step (iii) including performing wet etching and/or dry etching on the back surface of the semiconductor silicon wafer.

The present invention further provides:

[13] the method of the above item [12], further comprising, between the steps (iii) and (iv), the step of forming a porous silicon layer on the back surface of the semiconductor silicon wafer.

The present invention further provides:

[14] a semiconductor chip obtained by the method of any one of the above items [8] to [13].

The present invention further provides:

[15] a semiconductor device including the semiconductor chip of any one of the above items [1], [2], [3], [4], [5], [6], [7] and [14].

The present invention is allowed to provide a semiconductor chip of high reliability with less risk of breakage and a method for manufacturing the same.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

DETAILED DESCRIPTION OF THE INVENTION

Preferred embodiment for carrying out the present invention will be described specifically and in detail with reference to the drawings.

First description is made about a semiconductor chip.

Figure 1:
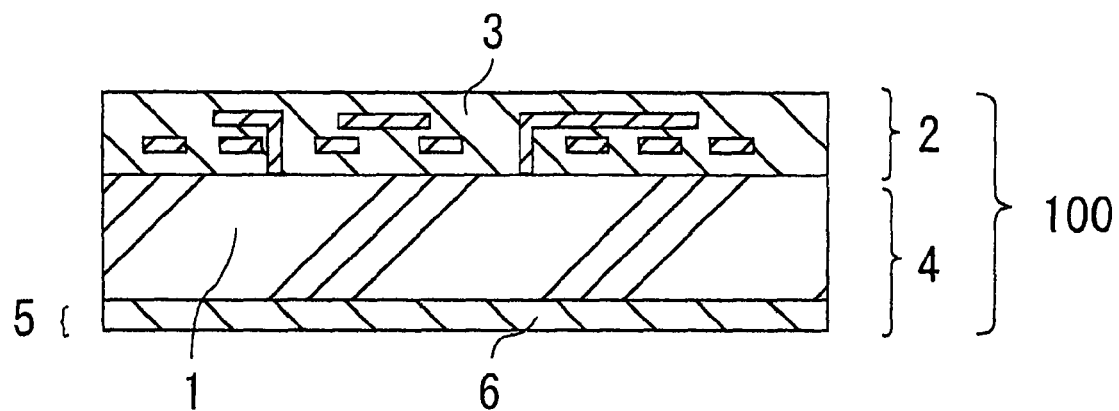
FIG. 1 is a substantial-part cross sectional view schematically illustrating a semiconductor chip according to an embodiment of the present invention.

FIG. 1 is a substantial-part cross sectional view schematically illustrating a semiconductor chip according to an embodiment of the present invention.

As illustrated in FIG. 1, a semiconductor chip 100 of the present invention includes a semiconductor silicon substrate 1 obtained usually by dicing a worked semiconductor silicon wafer.

There is not limitation to a semiconductor silicon wafer as a raw material of this worked semiconductor silicon wafer 100, and any semiconductor silicon wafer usually used as semiconductor silicon wafer can be used in the present invention.

The semiconductor silicon wafer used in the present invention can be commercially available one.

The semiconductor chip 100 of the present invention is required to have a semiconductor device layer 3 provided on a main surface region 2 which is a one surface of the semiconductor silicon substrate 1.

There is no particular limitation imposed on the semiconductor device layer 3 as long as it can serve to make the semiconductor chip 100 function as a semiconductor device. For example, the semiconductor device layer 3 may have formed on the main surface region 2 of the semiconductor silicon substrate 1 of the semiconductor chip 100 an impurity layer of an impurity element of a trivalent element such as boron, gallium or indium or a quinquevalent element such as phosphorus, arsenicum or antimony. Besides, in accordance with the property of the desired semiconductor chip 100, the semiconductor device layer 3 may include one or more of an epitaxial layer, an insulating film, an electrode, an interlayer insulating film, a plug structure, a barrier layer, a metal wiring layer, an antireflective layer and passivation layer, appropriately.

The above-mentioned impurity layer and the like may be combined thereby to form a bipolar structure, a single channel MOS structure of n channel, p channel or the like, a CMOS structure of p well, n well, twin well or the like on the main surface region 2 of the semiconductor chip 100. One or more of these structures may be combined appropriately to make the semiconductor chip function as a semiconductor device such as a memory device or a logic device.

Here, the main surface region 2 means a region including the semiconductor device layer 3 in FIG. 1, which is a region from the surface of the semiconductor chip 100 to 50% thickness of the semiconductor chip 100 relative to the normal direction to the surface of the semiconductor chip 100. The region is preferably from the surface of the semiconductor chip 100 to 20% thickness of the semiconductor chip 100, or more preferably to 10% thickness of the semiconductor chip 100.

The semiconductor chip 100 of the present invention may include impurity elements on a region 4 of the semiconductor silicon substrate 1, as illustrated in FIG. 1/

Specific examples of the region 4 include a p+ region, a p− region, an n+ region, an n− region and the like.

Impurity elements contained in the p+ region and/or the p− region include trivalent element such as boron, gallium and indium.

Impurity elements contained in the n+ region and/or the n− region include quinquevalent element such as phosphorus, arsenicum and antimony.

The impurity concentration of the p+ region generally ranges from $1\times10^{17}/cm^3$ to $5\times10^{20}/cm^3$, while the impurity concentration of the p− region generally is less than $1\times10^{17}/cm^3$.

The impurity concentration of the n+ region generally ranges from $1\times10^{17}/cm^3$ to $5\times10^{20}/cm^3$, while the impurity concentration of the n− region generally is less than $1\times10^{17}/cm^3$.

The impurity concentration of both of the p− region and the n− region preferably ranges from $1\times10^{13}/cm^3$ to $1\times10^{17}/cm^3$.

The main surface region 2 is preferably a p+ region. More preferably, an impurity element contained in the p+ region is boron. The boron concentration in the main surface region 2 is more preferably $1\times10^{18}/cm^3$ or more.

Then, the semiconductor chip 100 of the present invention is required to have a porous silicon domain layer 6 in a main surface region 5 on the back surface which is the other surface of the semiconductor silicon substrate 1.

Figure 2:
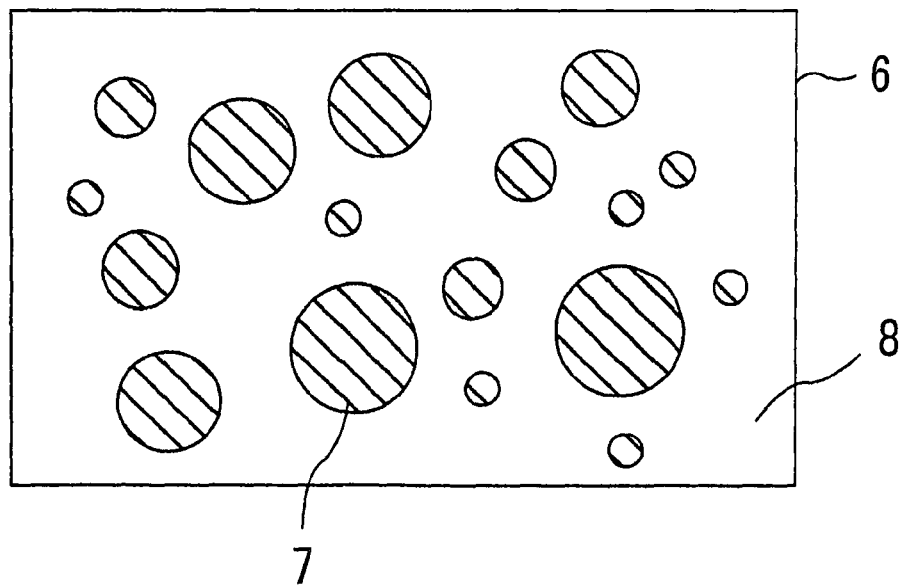
FIG. 2 is a substantial-part view schematically illustrating an enlarged back surface of a semiconductor silicon substrate.

FIG. 2 is a schematic diagram of the substantial part illustrating an enlarged back surface of the semiconductor silicon substrate 1 of FIG. 1. As illustrated in FIG. 2, porous silicon domains 7 in the porous silicon domain layer 6 are porous silicon dispersed like islands on the back surface of the semiconductor silicon substrate 1.

As illustrated in FIG. 2, in the porous silicon domain layer 6, a silicon single crystal 8 of the semiconductor silicon substrate exists surrounding the porous silicon domains 7.

Figure 3:
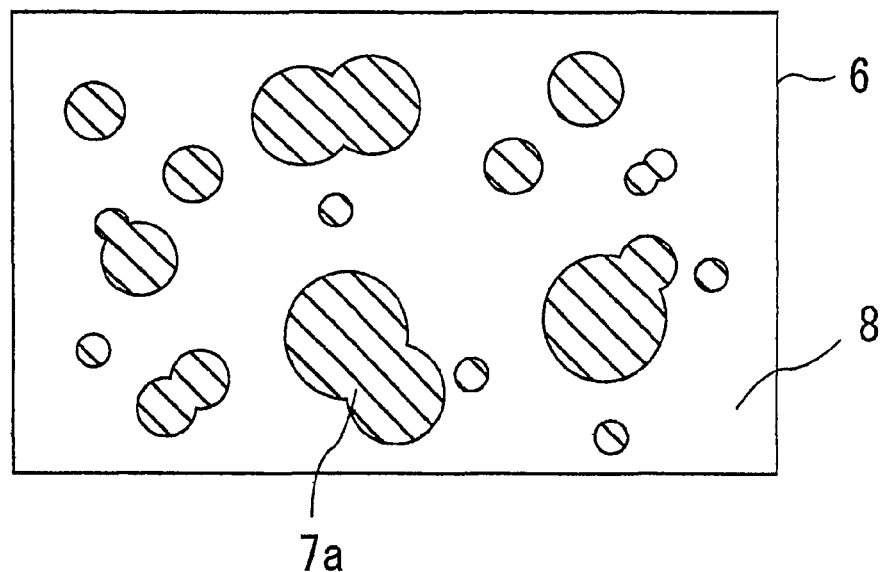
FIG. 3 is a substantial-part view schematically illustrating porous silicon domains seem from the back surface of the semiconductor silicon substrate.
Figure 4:
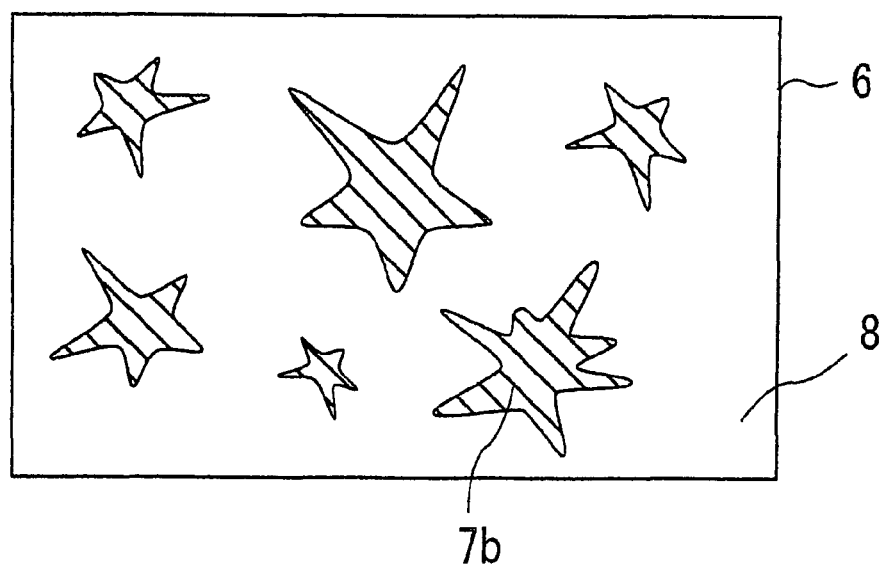
FIG. 4 is a substantial-part view schematically illustrating porous silicon domains seem from the back surface of the semiconductor silicon substrate.
Figure 5:
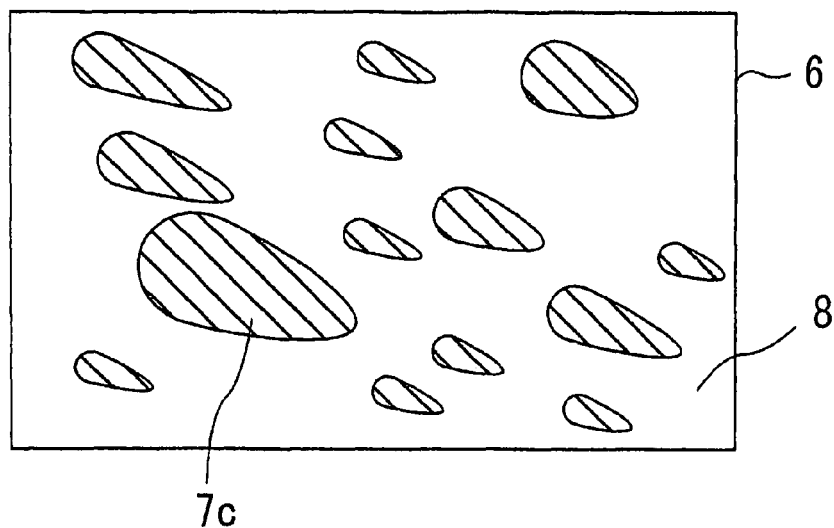
FIG. 5 is a substantial-part view schematically illustrating porous silicon domains seem from the back surface of the semiconductor silicon substrate.

The porous silicon domains 7 seen from the back surface of the semiconductor silicon substrate 1 are approximately circular as shown in FIG. 2, however, the shape of all of the porous silicon domains 7 is not limited to a complete circle. For example, as shown in FIG. 3, the shape of one porous silicon domain 7 may be a shape of combined circles or an elliptic shape. As shown in FIG. 4, the shape of one porous silicon domain 7 may be a shape of liquid dropped from a height to the back surface of the semiconductor silicon substrate 1, or as shown in FIG. 5, the shape of one porous silicon domain 7 may be a shape of liquid flowing on the inclined back surface of the semiconductor silicon substrate 1.

In addition, the silicon single crystal 8 can include an impurity element. The impurity element is the same as mentioned above, however, it is preferably boron. The concentration of the boron is more preferably $1\times10^{18}/cm^3$ or more.

Figure 6:
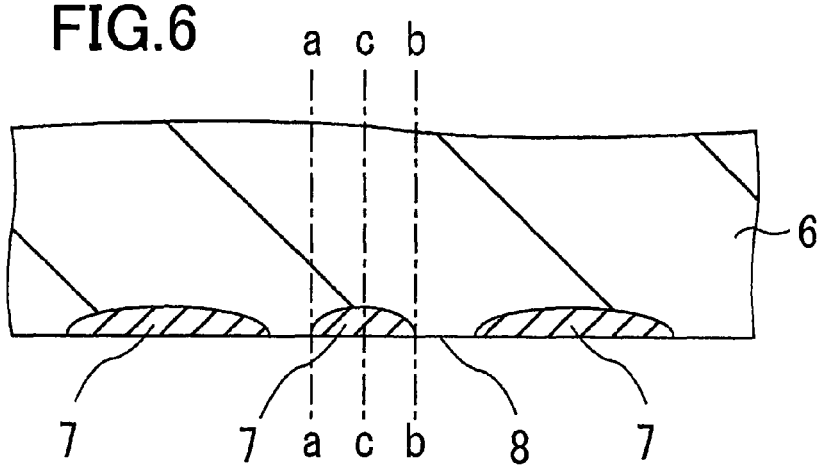
FIG. 6 is a substantial-part cross sectional view schematically illustrating an enlarged cross section of a porous silicon domain layer of the semiconductor chip.

FIG. 6 is a substantial-part cross sectional view schematically illustrating an enlarged cross section of the porous silicon domain layer 6 of the semiconductor chip 100.

Among porous silicon domains 7 in the porous silicon domain layer 6, an average diameter of porous silicon domains 7 appearing on the back surface of the semiconductor silicon substrate 1 preferably ranges from 0.2 to 800 μm on the assumption that the shape of each porous silicon domain 7 is replaced with a circle of the same area.

If this average diameter is less than 0.2 μm or more than 800 μm, the stress relaxation effect of the porous silicon domain layer 6 on the semiconductor chip 100 is likely to be reduced thereby reducing the reliability of the obtained semiconductor chip 100.

Here, for the semiconductor chip 100, the average diameter is calculated with reference to the outermost surface of the silicon single crystal 8 in the back surface of the semiconductor silicon substrate 1.

Replacing of the shape of a porous silicon domain 7 with a circle of the same area is performed, for example, by getting a shot of the back surface of the semiconductor silicon substrate 1 before performing image processing of the shot image by use of a computer.

The total area of the porous silicon domains 7 appearing in the porous silicon domain layer 6 on the back surface of the semiconductor silicon substrate 1 preferably ranges from 10 to 90% of the total area of the back surface of the semiconductor silicon substrate 1.

When the total area of the porous silicon domains 7 is less than 10% or more than 90% of the back surface, the stress relaxation effect of the porous silicon domain layer 6 on the semiconductor chip 100 is likely to be reduced thereby reducing the reliability of the obtained semiconductor chip 100.

The thickness of each porous silicon domain 7 is preferably equal to or less than half the average diameter of the porous silicon domains 7 relative to the normal direction to the surface of the semiconductor chip 100. The average diameter used here is as described above, a diameter of a circle obtained by replacing the porous silicon domain 7 with the circle of the same area.

Here, description is given with reference to FIG. 6. If the shape of each porous silicon domain 7 appearing in the porous silicon domain layer 6 on the back surface of the semiconductor silicon substrate 1 is a circle, the diameter of the porous silicon domain 7 is indicated by a distance between the dash-dotted line a-a and the dash-dotted line b-b both of which lines show the normal direction to the surface of the semiconductor chip 100. The dash-dotted line c-c is a line passing through the deepest part of the porous silicon domain 7 and showing the normal direction to the surface of the semiconductor chip 100. The thickness of the porous silicon domain 7 is indicated by a distance of the dash-dotted line c-c in the porous silicon domain 7. The thickness of the porous silicon domain 7 is preferably equal to or less than half the diameter of the porous silicon domain 7.

Figure 7:
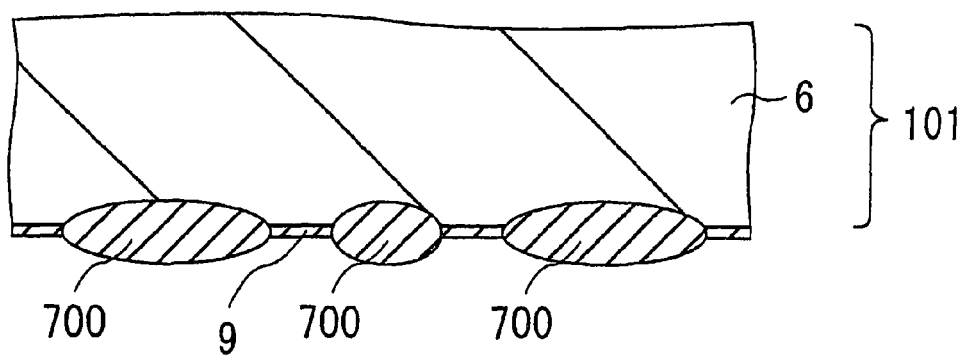
FIG. 7 is a substantial-part cross sectional view schematically illustrating a semiconductor chip according to another embodiment of the present invention.

FIG. 7 is a substantial-part cross sectional view schematically illustrating a semiconductor chip according to another embodiment of the present invention.

In other words, FIG. 7 is a substantial-part cross sectional view schematically illustrating an enlarged porous silicon domain layer 6 of the semiconductor chip 101 of the present invention, and configuration other than the porous silicon domain layer 6 is the same as that in the semiconductor chip 100.

As illustrated in FIG. 7, each porous silicon domain 700 is raised in a convex shape from the aforementioned back surface of the semiconductor silicon substrate 1 to the outside.

Besides, there is a porous silicon layer 9 formed on the back surface of the semiconductor silicon substrate 1 except for the porous silicon domains 700.

Figure 8:
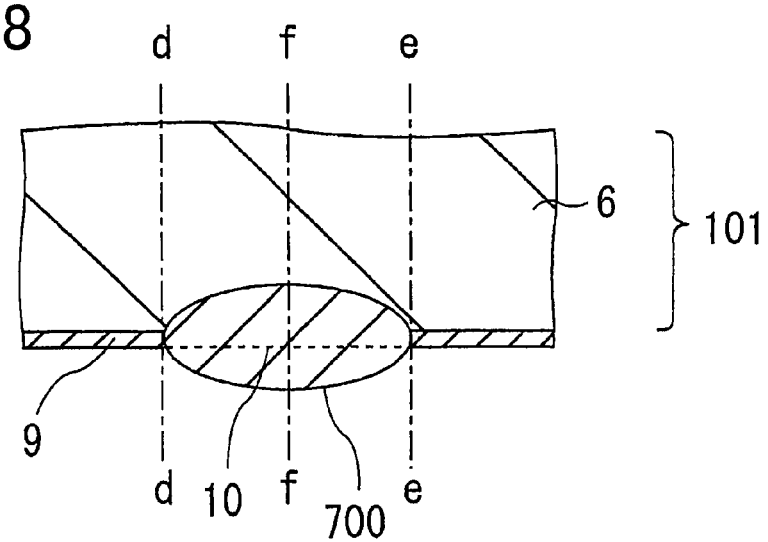
FIG. 8 is a substantial-part cross sectional view schematically illustrating enlarged silicon domains in the porous silicon domain layer.

FIG. 8 is a substantial-part cross sectional view schematically illustrating an enlarged porous silicon domain 700 of the porous silicon domain layer 6 of FIG. 7.

The average diameter of each porous silicon domain 700 appearing on the porous silicon domain layer 6 on the back surface of the semiconductor silicon substrate preferably ranges from 0.2 to 800 μm relative to the outermost surface of the porous silicon layer 9, which is a length of the outermost surface cut by the porous silicon domain 700.

This average diameter is less than 0.2 μm or more than 800 μm, the stress relaxation effect of the porous silicon domain layer 6 on the semiconductor chip 101 is likely to be reduced thereby reducing the reliability of the obtained semiconductor chip 101.

Here, the average diameter of the porous silicon domain 700 is explained with reference to FIG. 8. When each porous silicon domain 700 appearing in the porous silicon domain layer 6 on the back surface of the semiconductor silicon substrate 1 is a circle, the diameter of the porous silicon domain 700 is indicated by a distance between the dash-dotted line d-d and the dash-dotted line e-e both of which lines show the normal direction to the surface of the semiconductor chip 101. Here, in FIG. 8, the diameter 10 is indicated by the broken line.

The dash-dotted line f-f is a line passing through the deepest part of the porous silicon domain 700 and showing the normal direction to the surface of the semiconductor chip 101. The thickness of the porous silicon domain 700 is indicated by a distance of the dash-dotted line f-f in the porous silicon domain 700.

As illustrated in FIG. 8, when the porous silicon domain 700 is raised in a convex shape to the outer side of the porous silicon layer 9, the thickness of the porous silicon domain 700 is preferably equal to or less than a quarter of the diameter of the porous silicon domain 7.

The total area of porous silicon domains 7 appearing in the porous silicon domain layer 6 on the back surface of the semiconductor silicon substrate 1 preferably ranges from 10 to 90% of the total area of the back surface of the semiconductor silicon substrate 1.

When the total area of the porous silicon domains 7 is less than 10% or more than 90% of the total area of the back surface, the stress relaxation effect of the porous silicon domain layer 6 on the semiconductor chip 101 is likely to be reduced thereby reducing the reliability of the obtained semiconductor chip 101.

The thickness of the porous silicon layer 9 illustrated in FIG. 8 usually ranges from 0.01 to 0.2 μm, and preferably ranges from 0.05 to 0.1 μm.

When the thickness of the porous silicon layer 9 is less than 0.01 μm, there often occur malfunctions. If the thickness of the porous silicon layer 9 is more than 0.2 μm, the thickness becomes close to the thickness of the porous silicon domain layer 6, which is likely to bring about reduction in the stress relaxation effect of the porous silicon domain layer 6.

Figure 9:
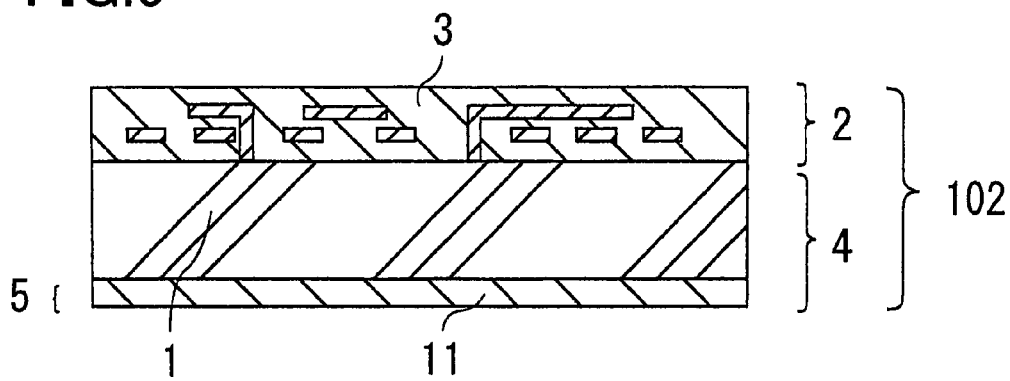
FIG. 9 is a substantial-part cross sectional view schematically illustrating a semiconductor chip according to yet another embodiment of the present invention.

FIG. 9 is a substantial-part cross sectional view schematically illustrating a semiconductor chip according to another embodiment of the present invention.

The configuration of the semiconductor chip 102 as illustrated in FIG. 9 is the same as that of the semiconductor chip 100 shown in FIG. 1 except for a dimple layer 11 provided in a main surface region 5 on the back surface which is the other surface of the semiconductor silicon substrate 1 instead of the porous silicon domain layer 6.

Figure 10:
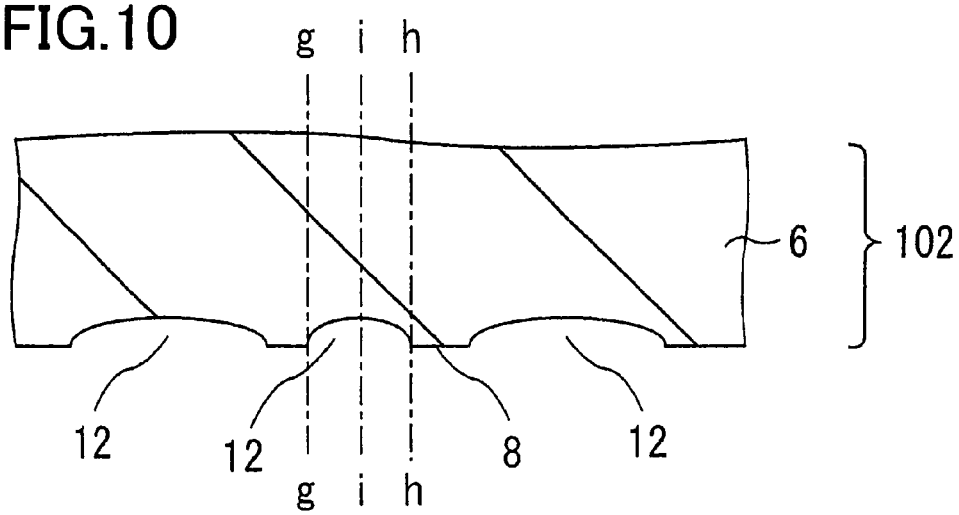
FIG. 10 is a substantial-part cross sectional view schematically illustrating an enlarged dimple layer.

FIG. 10 is a substantial-part cross sectional view of the dimple layer 11 of FIG. 9, in which the dimple layer 11 is shown enlarged.

As illustrated in FIG. 10, the dimple layer 11 has dimples 12 provided thereon.

Figure 11:
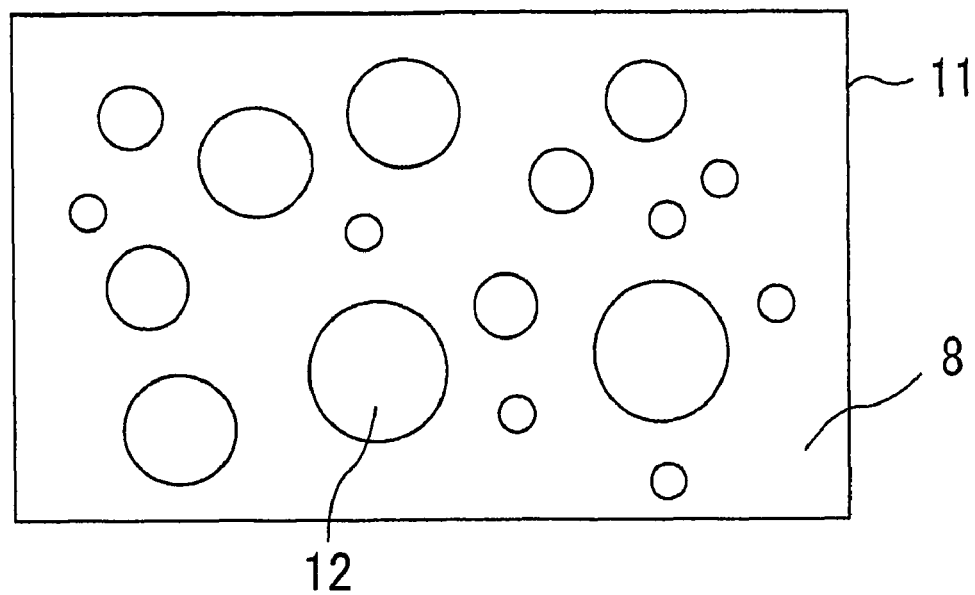
FIG. 11 is a substantial-part view schematically illustrating a shape of the dimples seen from the back surface of the semiconductor silicon substrate.
Figure 12:
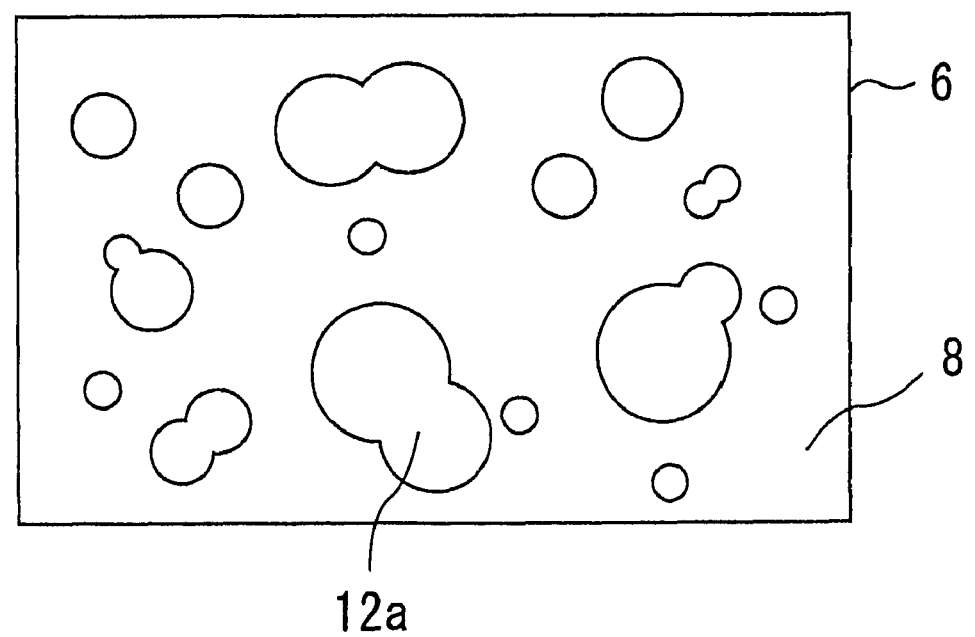
FIG. 12 is a substantial-part view schematically illustrating a shape of the dimples seen from the back surface of the semiconductor silicon substrate.
Figure 13:
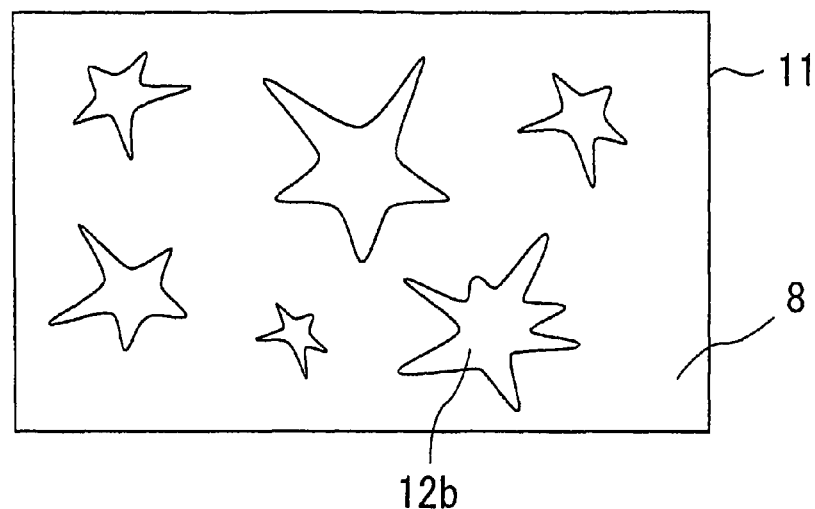
FIG. 13 is a substantial-part view schematically illustrating a shape of the dimples seen from the back surface of the semiconductor silicon substrate.
Figure 14:
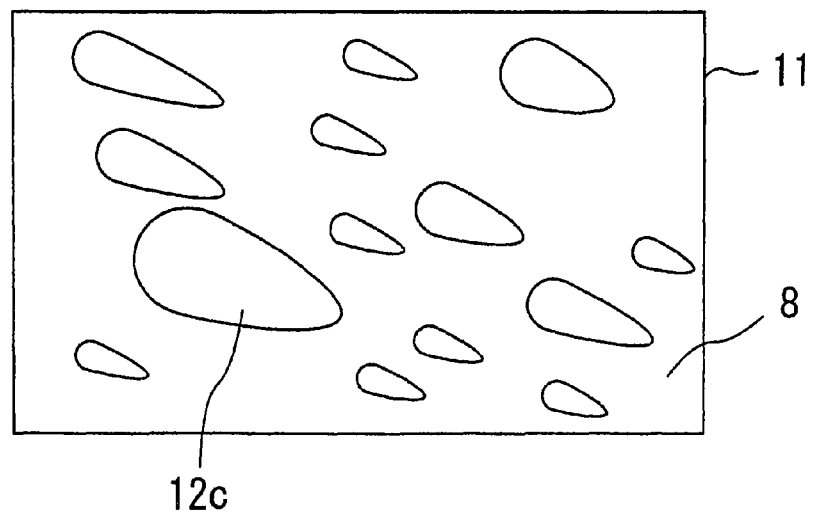
FIG. 14 is a substantial-part view schematically illustrating a shape of the dimples seen from the back surface of the semiconductor silicon substrate.

FIG. 11 is a schematic diagram of the substantial part illustrating the shape of the dimples 12.

As illustrated in FIG. 11, the dimples 12 are dispersed likes islands on the back surface of the semiconductor silicon substrate 1. The dimples 12 are concave portions formed in the silicon single crystal 8.

Each dimple 12 has various shapes illustrated in FIGS. 11 to 14, as is the case of the porous silicon domain 7 of FIGS. 2 to 5 described above.

The average diameter, the depth and the like are the same as those of the porous silicon domain 7 of FIG. 6 as described above.

Here, description is given with reference to FIG. 10. When each dimple 12 appearing on the back surface of the semiconductor silicon substrate 1 is a circle, the diameter of the dimple 12 is indicated by a distance between the dash-dotted line g-g and the dash-dotted line h-h both of which lines show the normal direction to the surface of the semiconductor chip 102.

The dash-dotted line i-i is a line passing through the deepest part of the dimple 12 and showing the normal direction to the surface of the semiconductor chip 102. The thickness of the dimple 12 is indicated by a distance of the dash-dotted line i-i in the dimple 12.

Figure 15:
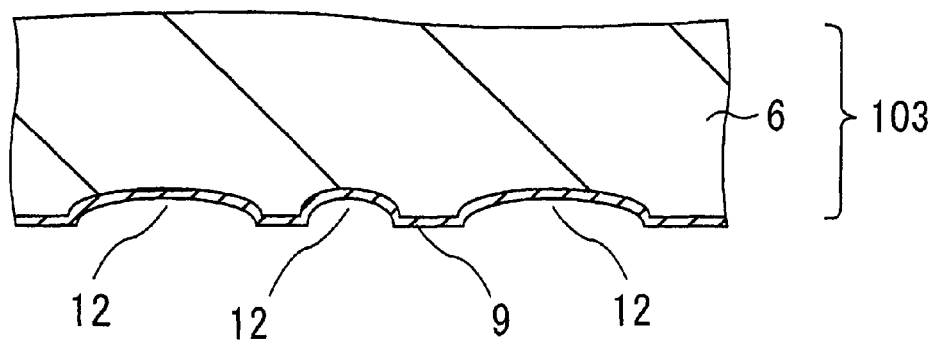
FIG. 15 is a substantial-part cross sectional view schematically illustrating a semiconductor chip according to yet another embodiment of the present invention.

FIG. 15 is a substantial-part cross sectional view schematically illustrating a semiconductor chip according to another embodiment of the present invention.

In the substantial-part cross sectional view of FIG. 15, the back surface of the semiconductor silicon substrate 1 in the semiconductor chip 103 is shown enlarged, and the configuration is the same as that of the semiconductor chip 102 illustrated in FIG. 10 except for a porous silicon layer 9 provided on the back surface.

The thickness of the porous silicon layer 9 illustrated in FIG. 15 usually ranges from 0.01 to 0.5 μm and preferably, from 0.05 to 0.2 μm.

When the thickness of the porous silicon layer 9 is less than 0.01 μm, there often occur malfunctions. On the other hand, when the thickness exceeds 0.5 μm, the mechanical strength of the porous silicon layer 9 becomes poor, which tends to cause a breakage of the porous silicon layer 9 in packaging and its malfunctions.

Next description is made about a manufacturing method of the present invention having a porous silicon domain layer as described above.

Figure 16:
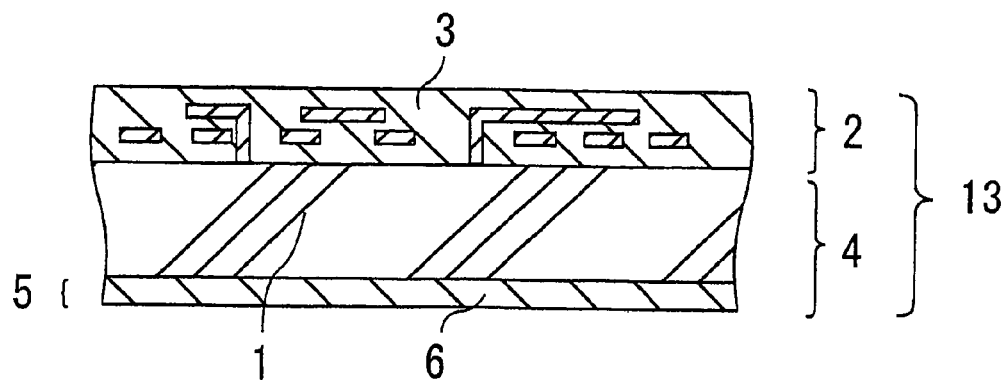
FIG. 16 is a substantial-part cross sectional view schematically illustrating a semiconductor silicon wafer 13.

FIG. 16 is a substantial-part cross sectional view of a semiconductor silicon wafer 13.

In order to manufacture a semiconductor chip of the present invention, as illustrated in FIG. 16 for example, first, it is necessary to form a semiconductor device layer 3 on a main surface region 2 on the surface, or one surface, of the semiconductor silicon wafer 13.

There is no limitation to the forming method of the semiconductor device layer 3 as long as the semiconductor device layer 3 is configured to function as a semiconductor device such as a memory device or a logic device, and the semiconductor device layer 3 can be formed in accordance with any normally performed method.

For example, an impurity layer is formed on the main surface region 2 of the semiconductor silicon wafer 13 by a thermal diffusion method using a deposition device, a drive in device or the like or ion implantation method using an ion implantation device, an annealing device or the like. In addition to these methods, one or two of formation of an epitaxial layer, formation of an insulating film, formation of an electrode, formation of interlayer insulating film, formation of a plug structure, formation of a barrier layer, formation of a metal wiring layer, formation of an antireflection film, formation of a passivation film and the like are performed, or combined to be performed, thereby to have the semiconductor device layer 3 formed on the main surface region 2 of the semiconductor silicon wafer 13.

There is no particular limitation to conditions to perform these methods, conditions of lithography to perform the methods and the like, and any conditions usually adopted in manufacturing of a semiconductor chip can be selected appropriately.

Next, in order to manufacture the semiconductor chip of the present invention, it is required to grind the back surface, or the other surface, of the semiconductor silicon wafer 13 up to a predetermined thickness.

The predetermined thickness usually ranges from 30 to 1500 μm, preferably from 50 to 300 μm, more preferably from 60 to 150 μm, and still more preferably from 70 to 120 μm.

There is no limitation to the method of grinding the back surface of the semiconductor silicon wafer 13, and any usually-performed method can be adopted to perform grinding.

In order to manufacture the semiconductor chip of the present invention, it is possible to, in addition to the grinding, perform polishing of the back surface of the semiconductor silicon wafer 13.

There is no limitation to polishing, which can be performed by any normally-performed method. For example, polishing can be performed by CMP or the like.

Then, in order to manufacture a semiconductor chip of the present invention, it is necessary to form a porous silicon domain layer 6 on the back surface of the aforementioned semiconductor silicon wafer 13.

Forming of the porous silicon domain layer 6 can be performed even when polishing is omitted or after polishing.

Forming of the porous silicon domain layer 6 can be performed by, for example, a method of bringing a mixed vapor of hydrofluoric acid and nitric acid into contact with the back surface of the semiconductor silicon wafer 13.

The mixed vapor of hydrofluoric acid and nitric acid used in this method may be, for example, a vapor generated from mixed liquid of 49% hydrofluoric acid solution and concentrated nitric acid.

When the mixed liquid is prepared, the mixture ratio of 49% hydrofluoric acid solution and concentrated nitric acid preferably ranges from 1:1 to 1:100 on the basis of volumes before mixing, and more preferably ranges from 1:5 to 1:10.

The temperatures of the mixed liquid when the mixed vapor is generated of hydrofluoric acid and nitric acid preferably ranges from 30 to 60° C. and more preferably, from 40 to 55° C. In addition, the temperature of the mixed vapor preferably ranges from 40 to 45° C.

Besides, when the mixed vapor of hydrofluoric acid and nitric acid is brought into contact with the back surface of the semiconductor silicon wafer 13, the temperature of the semiconductor silicon wafer 13 preferably ranges from 0 to 40° C., and more preferably from 10 to 35° C. The temperature further more preferably ranges from 20 to 30° C.

Further, when the back surface of the semiconductor silicon wafer 13 is brought in contact with the mixed vapor of hydrofluoric acid and nitric acid, the back surface of the semiconductor silicon wafer 13 and the mixed vapor of hydrofluoric acid and nitric acid can be irradiated with light.

A light source of the light may be for example, a mercury lamp, a halogen lamp, an arc lamp, a fluorescent lamp or the like. Preferably, the light source is a fluorescent lamp.

If the time of keeping the back surface of the semiconductor silicon wafer 13 in contact with the mixed vapor of hydrofluoric acid and nitric acid is controlled, it is possible to control the number of porous silicon domains 700 that appear on the porous silicon domain layer 6 shown in FIG. 7.

Specifically, it is possible to control the total area of the porous silicon domains appearing on the back surface of the semiconductor silicon substrate in the porous silicon domain layer to be in the range of 10 to 90% of the back surface.

Figure 27:
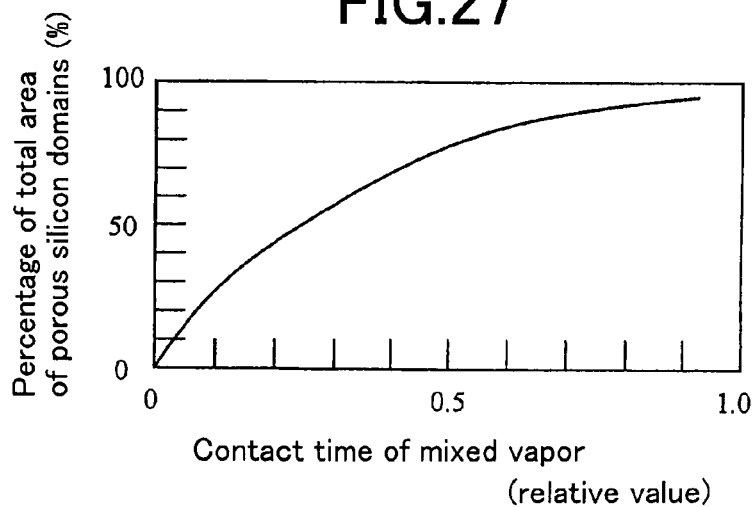
FIG. 27 is a graph showing the relationship between the contact time of a mixed vapor of hydrofluoric acid and nitric acid and a ratio of the total area of the porous silicon domains to the back surface of the semiconductor silicon substrate.

FIG. 27 is a graph showing a relationship between the contact time of the mixed vapor of hydrofluoric acid and nitric acid with the back surface of the semiconductor silicon wafer 13 and a ratio of the total area of the porous silicon domains relative to the back surface of the semiconductor silicon substrate.

As shown in the graph, when the contact time of the mixed vapor of hydrofluoric acid and nitric acid is longer, the ratio of the total area of porous silicon domains is likely to be increased.

On the other hand, by controlling a temperature difference between the temperature of the semiconductor silicon wafer 13 and the temperature of the mixed vapor of hydrofluoric acid and nitric acid, it is possible to control the size of the diameter of each porous silicon domain 700.

Specifically, by controlling the temperature difference to be smaller, it is possible to reduce dew condensation of the mixed vapor on the semiconductor silicon wafer 13, and to decrease the diameter of each porous silicon domain 700.

On the other hand, by controlling the temperature difference to be larger, it is possible to enlarge dew condensation of the mixed vapor on the semiconductor silicon wafer 13 and to increase the diameter of each porous silicon domain 700.

Figure 28:
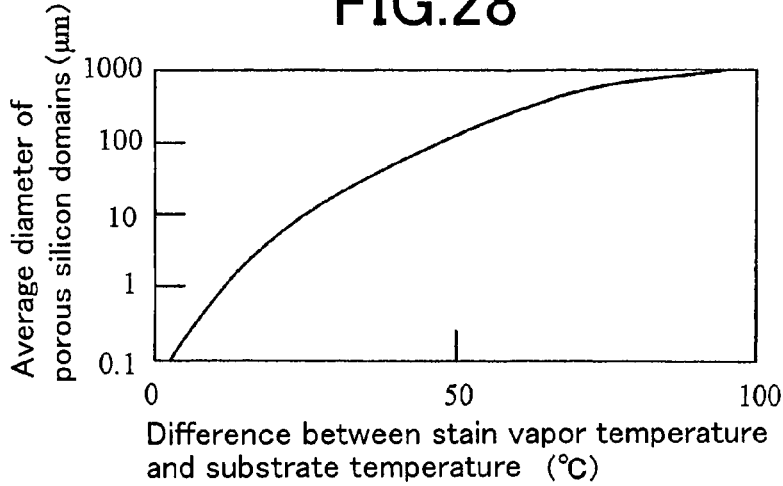
FIG. 28 is a graph of a difference between the temperature of the semiconductor silicon wafer and the temperature of the mixed vapor of hydrofluoric acid and nitric acid, indicated by the horizontal axis, and an average diameter of the porous silicon domains indicated by the vertical axis.

FIG. 28 is a graph of the temperature difference between the temperature of the semiconductor silicon wafer 13 and the temperature of the mixed vapor of hydrofluoric acid and nitric acid, indicated on horizontal axis, and the average diameter of the porous silicon domains, indicated on the vertical axis. The aforementioned tendency is supported by this graph.

In this way, the porous silicon domain layer 6 illustrated in FIG. 7 can be formed.

At a portion where a dew condensation of the mixed vapor of hydrofluoric acid and nitric acid is seen, as shown in FIG. 7, the porous silicon domains 700 are formed to be island-shaped and thick, and at the other portion, the porous silicon layer 9 is formed to be thinner.

When the porous silicon domain layer as illustrated in FIG. 7 is subjected to polishing, for example, the porous silicon domain layer 6 illustrated in FIG. 6 can be formed.

The round shape of the porous silicon domain 7 shown in FIG. 2 can be obtained by, for example, keeping the semiconductor silicon wafer 13 stable when the back surface of the semiconductor silicon wafer 13 is in contact with the mixed vapor of hydrofluoric acid and nitric acid.

In addition, the shape of combined circles of the porous silicon domain 7 illustrated in FIG. 3 can be obtained by, for example, swinging the semiconductor silicon wafer 13 appropriately when the back surface of the semiconductor silicon wafer 13 is in contact with the mixed vapor of hydrofluoric acid and nitric acid.

Further, the shape of the porous silicon domain 7 such as obtained by dropping liquid from the height onto the back surface as illustrated in FIG. 4 can be obtained by, for example, slightly swinging the semiconductor silicon wafer 13 when the back surface of the semiconductor silicon wafer 13 is in contact with the mixed vapor of hydrofluoric acid and nitric acid.

Furthermore, the shape of the porous silicon domain 7 such as obtained by making liquid drops flow on the inclined surface as illustrated in FIG. 5 can be obtained by, for example, inclining the semiconductor silicon wafer 13 appropriately when the back surface of the semiconductor silicon wafer 13 is in contact with the mixed vapor of hydrofluoric acid and nitric acid.

Next, in order to manufacture a semiconductor chip of the present invention, it is necessary to perform dicing on the worked semiconductor silicon wafer obtained by passing through the step of forming a semiconductor device layer, the step of grinding, the step of forming a porous silicon domain layer and the like.

The method of dicing the worked semiconductor silicon wafer is not limited, but dicing can be performed by using any commercially available dicing device.

After these steps, the semiconductor chip of the present invention can be obtained.

Next description is made about the method of manufacturing a semiconductor chip of the present invention having a dimple layer as described above.

Figure 17:
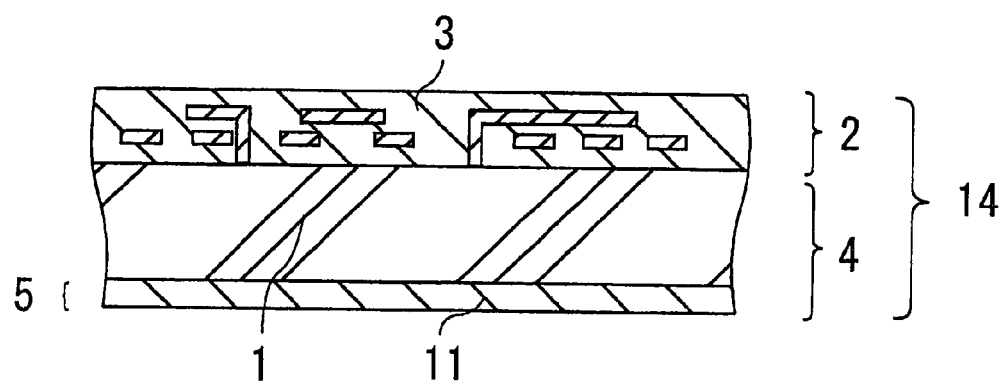
FIG. 17 is a substantial-part cross sectional view schematically illustrating a semiconductor silicon wafer 14.

FIG. 17 is a substantial-part cross sectional view schematically illustrating a semiconductor silicon wafer 14.

The semiconductor silicon wafer 14 is different from the semiconductor silicon wafer 13 illustrated in FIG. 16 in that the semiconductor silicon wafer 14 has a dimple layer 11 instead of the porous silicon domain layer 6 of the semiconductor silicon wafer 13.

Forming of the dimple layer 11 includes: removing porous silicon domains from the porous silicon domain layer formed on the back surface of the semiconductor silicon wafer obtained by the above-mentioned steps, performing wet etching on the back surface of the semiconductor silicon wafer 14 before the porous silicon domain layer is formed thereon, performing dry etching on the back surface of the semiconductor silicon wafer 14 the porous silicon domain layer is formed thereon, and the like.

Removing of the porous silicon domains from the porous silicon domain layer is for example performed by one or more of grinding, polishing, brush cleaning and the like.

These steps can be performed together, or can be replaced, with electroless wet chemical etching using hydrofluoric acid thereby to remove the porous silicon domains.

These steps are performed thereby to remove the porous silicon domains from the porous silicon domain layer 6 formed on the back surface of the semiconductor silicon wafer 13 and accordingly to form the dimple layer 11.

Figure 18:
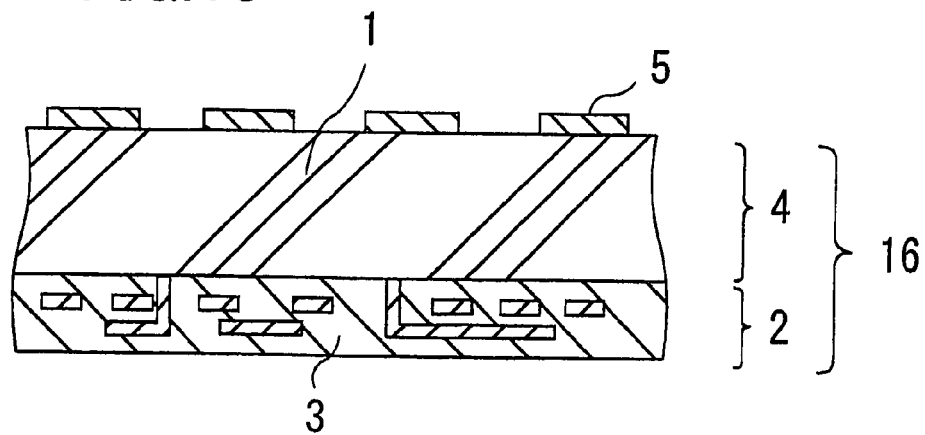
FIG. 18 is a substantial-part cross sectional view of the semiconductor silicon wafer for explaining the wet etching step.

In addition, wet etching on the back surface of the semiconductor silicon wafer before the porous silicon domain layer is formed thereon is performed, for example, by bringing the mixed vapor of hydrofluoric acid and nitric acid into contact with the back surface of the semiconductor silicon wafer 16 illustrated in FIG. 18.

Here, FIG. 18 is a substantial-part cross sectional view schematically illustrating a semiconductor silicon wafer 16 to explain the step of forming wet etching.

On the back surface of the semiconductor silicon wafer 16, a resist layer 15 is formed by well-known photolithography using resist. Here, the resist layer 5 is formed in such a manner that the semiconductor silicon wafer 16 is seen like islands on the back surface of the semiconductor silicon wafer 16. The resist layer 5 is then used as a mask and the back surface of the semiconductor silicon wafer 16 is brought into contact with the mixed liquid of hydrofluoric acid and nitric acid, and thereby the dimple layer having dimples illustrated in FIGS. 11 to 14 are formed.

The mixed liquid of hydrofluoric acid solution and concentrated nitric acid used in the above-mentioned method is, for example, a mixture of 49% hydrofluoric acid solution and concentrated nitric acid. The mixing ratio of the 49% hydrofluoric acid solution and concentrated nitric acid preferably ranges from 1:1 to 1:500 on the basis of volumes before mixing, and more preferably ranges from 1:10 to 1:100.

The temperature of the semiconductor silicon wafer 16 in bringing the mixed liquid of hydrofluoric acid and nitric acid into contact with the back surface of the semiconductor silicon wafer 16 ranges from 0 to 40° C.

If this temperature is less than 0° C., the speed of wet etching is likely to be decreased, while if the temperature exceeds 40° C., the workability of wet etching is likely to be reduced.

More preferably, the temperature ranges from 20 to 30° C.

Dry etching is performed on the back surface of the semiconductor silicon wafer before the porous silicon domain layer is formed thereon, for example, by performing plasma etching on the back surface of the semiconductor silicon wafer 16 shown in FIG. 18 as is the case of wet etching.

The plasma etching can be performed, for example, in the presence of mixed gas of sulfur hexafluoride, oxygen, argon and the like and under reduced pressure.

The mixture ratio of the mixed gas of sulfur hexafluoride/oxygen/argon is preferably 1-5/0.1-2/10-3 on the basis of the volume flow rate per unit of time. The ratio is more preferably, 2-4/0.5-1.5/15-25.

The pressure in performing the plasma etching preferably ranges from 200 to 800 Pa and more preferably ranges from 400 to 600 Pa.

After the plasma etching is performed, ashing to perform plasma etching in the presence of oxygen is carried out to remove the resist layer 5.

Through the aforementioned steps, the dimple layer having the dimples 12 as illustrated in FIGS. 11 to 14 can be formed.

Figure 19:
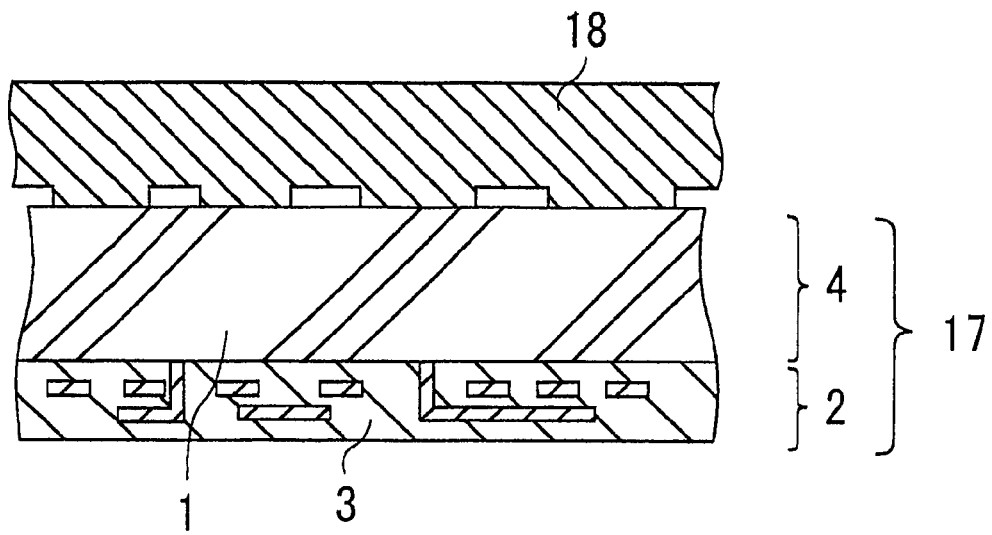
FIG. 19 is a substantial-part cross sectional view of the semiconductor silicon wafer for explaining the plasma etching step.

In performing the plasma etching, the resist layer 5 illustrated in FIG. 18 can be replaced with a resin mask 18. Specifically, as illustrated in FIG. 19, plasma etching can be performed on the back surface of the semiconductor silicon wafer 17 having the resin mask 18.

The plasma etching is preferably performed while pressing the resin mask 18 in the direction of the semiconductor silicon substrate 19.

The resin mask 18 consists of, for example, one or more kinds of thermoplastic resin including polyethylene, polypropylene and the like. The resin mask more preferably consists of polyethylene.

In addition, the resin mask 18 is provided with round protrusions. By selecting the shape of the protrusions appropriately, it is possible to form the dimple layer having dimples 12 and the like illustrated in FIGS. 11 to 14.

Figure 20:
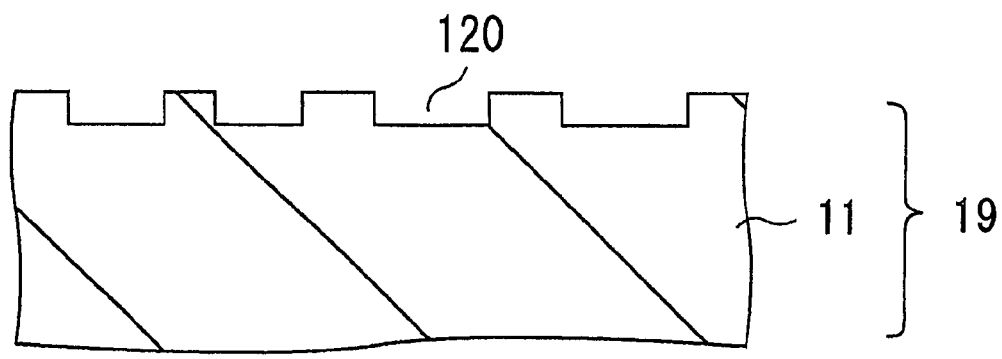
FIG. 20 is a substantial-part cross sectional view schematically illustrating an enlarged dimple layer of a worked semiconductor silicon wafer.

FIG. 20 is a substantial-part cross sectional view schematically illustrating an enlarged dimple layer 11 of the worked semiconductor silicon wafer 19.

The worked semiconductor silicon wafer 19 obtained by the step of performing wet etching on the back surface of the semiconductor silicon wafer 14, the step of performing dry etching on the back surface of the semiconductor silicon wafer 14 and the like has a cross section having recessed dimples 120, as shown in FIG. 20.

Here, in addition to the plasma etching step, the step of plasma etching using oxygen, the step of plasma etching using nitrogen and the like can be performed to form one or more of a oxide film, a nitride film and the like on the dimple layer (not shown).

After the dimple layer is formed, a porous silicon layer can be formed just over the dimple layer.

Figure 21:
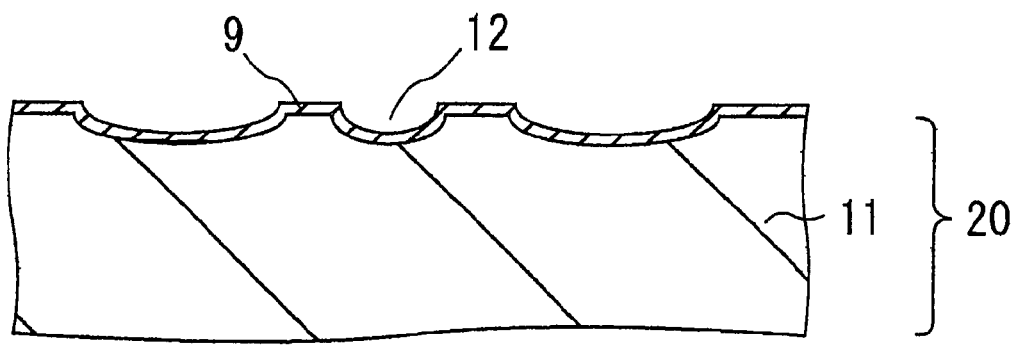
FIG. 21 is a substantial-part cross sectional view schematically illustrating an enlarged porous silicon layer formed on the worked semiconductor silicon wafer.

FIG. 21 is a substantial-part cross sectional view of a worked semiconductor silicon 20 having dimples 12 obtained by removing porous silicon domains from the porous silicon domain layer formed on the back surface of the semiconductor silicon wafer, in which figure a porous silicon layer 9 formed on the worked semiconductor silicon 20 is shown enlarged.

Figure 22:
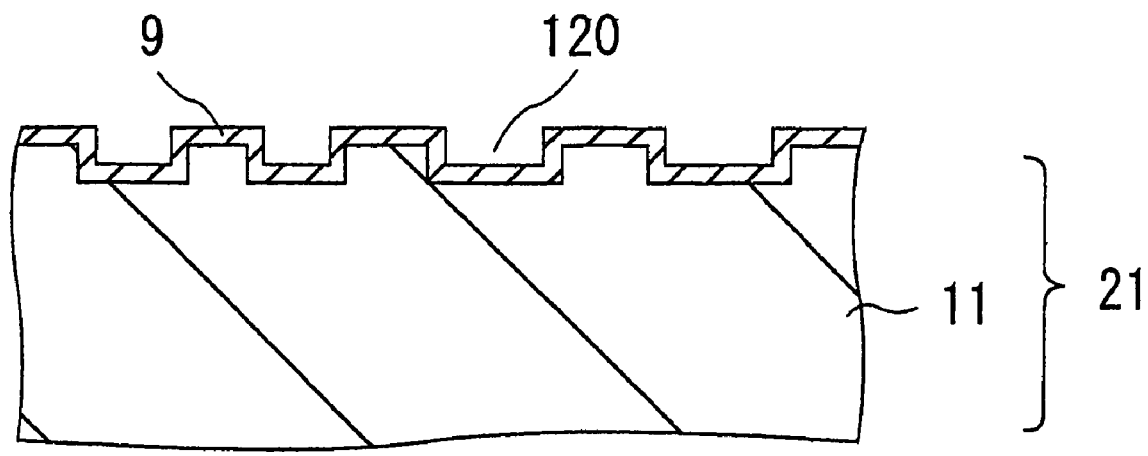
FIG. 22 is a substantial-part cross sectional view schematically illustrating an enlarged porous silicon layer formed on the worked semiconductor silicon wafer.

FIG. 22 is a substantial-part cross sectional view of a worked semiconductor silicon 21 obtained by performing wet etching on the back surface of the semiconductor silicon wafer, performing dry etching and the like, in which figure a porous silicon layer 9 formed on the semiconductor silicon 21 is shown enlarged.

The porous silicon layer 9 can be provided in a method, such as a stain etching method and anodization method.

In consideration of properties of the obtained semiconductor chip, preferably, the porous silicon layer 9 is formed by the stain etching method.

The stain etching method is performed, specifically, by the action of mixed liquid of hydrofluoric acid solution and concentrated nitric acid or the like on the back surface of the semiconductor silicon wafer.

The mixed liquid of hydrofluoric acid solution and concentrated nitric acid may be, for example, a mixture of 49% hydrofluoric acid solution and concentrated nitric acid. In this case, it is preferable that the volume of the concentrated nitric acid before mixing is less than the volume of the 49% hydrofluoric acid solution.

The volume ratio of the 49% hydrofluoric acid solution and concentrated nitric acid preferably ranges from 10:1 to 5000:1 on the basis of volumes before mixing.

As the ratio of the hydrofluoric acid is larger, stain etching spends more time, and therefore, the volume ratio of 49% hydrofluoric acid solution and concentrated nitric acid preferably ranges from 100:1 to 1000:1 on the basis of the volumes before mixing.

Further, the mixture of the hydrofluoric acid solution and concentrated nitric acid may be added with detergent such as $NaNO_2$. The use amount of this detergent generally ranges from 0.1 to 1 g per 1 liter of the mixture of hydrofluoric acid solution and concentrated nitric acid.

The temperature of the mixture of the hydrofluoric acid solution and concentrated nitric acid acting on the back surface of the semiconductor silicon wafer usually ranges from 0 to 80° C.

If the temperature is less than 0° C., the speed of stain etching is likely to be slow, while if the temperature exceeds 80° C., the operability of stain etching is likely to be reduced.

As the temperature is higher, the speed of the stain etching is likely to be fast. However, the temperature preferably ranges from 40 to 60° C. in view of the operability of stain etching.

Further, when the mixture of the hydrofluoric acid solution and concentrated nitric acid is made to act on the back surface of the semiconductor silicon wafer, the back surface of the semiconductor silicon wafer and the mixture of the hydrofluoric acid solution and concentrated nitric acid can be radiated with light.

Light sources of the light include a mercury lamp, a halogen lamp, an arc lamp, and a fluorescent lamp. Preferably, the light source is a fluorescent lamp.

For example, when a semiconductor silicon wafer is used on the conditions that the temperature is 30° C. or less, radiation is performed with light from the fluorescent lamp, and a mixture of 49% hydrofluoric acid solution and concentrated nitric acid is used at a volume ratio of 500:1 on the basis of the volumes before mixing, the speed of stain etching ranges from 1000 to 1500 nm/m in the case of the semiconductor silicon wafer having p+ region, from 100 to 200 nm/m in the case of the semiconductor silicon wafer having p− region, from 200 to 300 nm/m in the case of the semiconductor silicon wafer having n+ region, and from 200 to 300 nm/m in the case of the semiconductor silicon wafer having n− region.

The aforementioned stain etching method is carried out thereby to have corrosions formed continuously in the direction to the inside of the semiconductor silicon wafer. This structure is, for example, the same as those of the porous silicon domains 7 illustrated in FIG. 6, the porous silicon domains 700 illustrated in FIG. 7 and the like.

Figure 23:
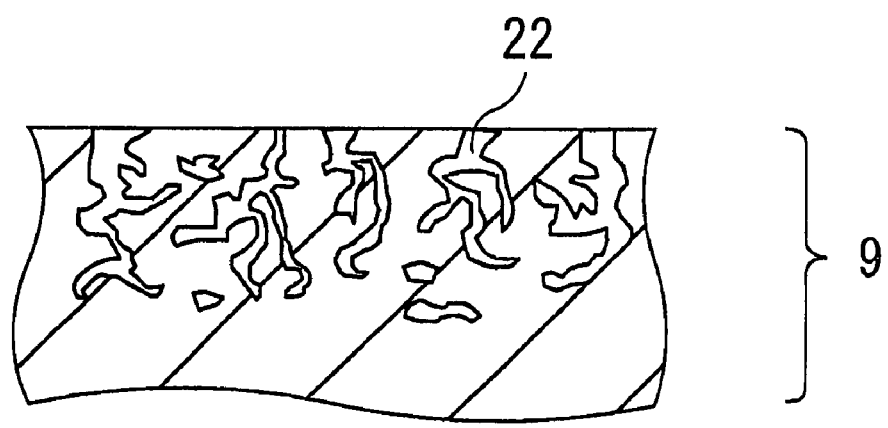
FIG. 23 is a substantial-part cross sectional view of enlarged porous silicon layer 9.

FIG. 23 is a substantial-part cross sectional view schematically illustrating an enlarged porous silicon layer 9 of FIG. 21 or 22.

As illustrated in FIG. 23, on the inner surface of each corrosion 22, an oxide film (not shown) is formed when the stain etching is performed. In this way, as illustrated in FIG. 21 or 22, the porous silicon layer 9 can be formed.

After the back surface of the semiconductor silicon wafer is subjected to action of the mixed liquid of hydrofluoric acid solution and concentrated nitric acid, purified water is used to clean the back surface of the semiconductor silicon wafer and then, the worked silicon wafer can be dried by a heating method, a method using centrifugal force by rotation, a gas blowing method, or the like.

In this way, the worked semiconductor silicon wafer can be obtained.

Then, in order to manufacture a semiconductor chip of the present invention, as is the case described above, the worked semiconductor silicon wafer obtained by forming of the semiconductor device layer, grinding, forming of the dimple layer and the like is required to be subjected to dicing There is no limitation on the dicing method of the worked silicon wafer, and dicing can be performed by using any commercially available dicing device.

These steps are performed thereby to obtain a semiconductor chip of the present invention The thus obtained semiconductor chip of the present invention can be used to manufacture various semiconductor devices including BGA, TCP, TSOP and TQFP.

For example, for BGA, the semiconductor chip is adhered onto a BGA substrate by an adhesive tape or the like, and then, a solder ball is deposited on the BGA substrate. The semiconductor chip, the solder ball and the like are subjected to necessary wire bonding operation, a passivation film is deposited on the semiconductor chip, the semiconductor chip is sealed by a semiconductor sealing resin, and then, a solder ball is placed if necessary, thereby obtaining a BGA having a semiconductor chip of the present invention mounted thereon.

The same goes for semiconductor devices other than the BGA, and they can be obtained by generally conducted method.

The semiconductor device obtained in this way can be used effectively, particularly for DRAM (Dynamic Random Access Memory) and the like.

[Operation]

As a semiconductor chip of the present invention has porous silicon domains 700 and a dimple layer 11 as shown in FIG. 10 and the like, even if a stress is applied to the semiconductor device, the stress is attenuated by the porous silicon domains 700, the dimple layer 11 and the like, and the semiconductor chip can be prevented from being damaged.

In addition, as illustrated in FIGS. 7, 15, 21, 22 and the like, the porous silicon domains 700 and the porous silicon layer 9 effectively serve as gettering layer. Even if there are metals adhered to the back surface of the semiconductor chip, these metals are prevented from spreading into the semiconductor chip and being melt thereby to reach the semiconductor device layer 3 at the main surface region of semiconductor chip.

With this configuration, it is possible to provide a semiconductor chip capable of preventing malfunctions from occurring in a semiconductor device and is of high reliability even when embedded in the semiconductor device.

The description below is made about the embodiments of the present invention more in detail, with reference to examples. However, these examples are not for limiting the present invention.

Example 1

Figure 24:
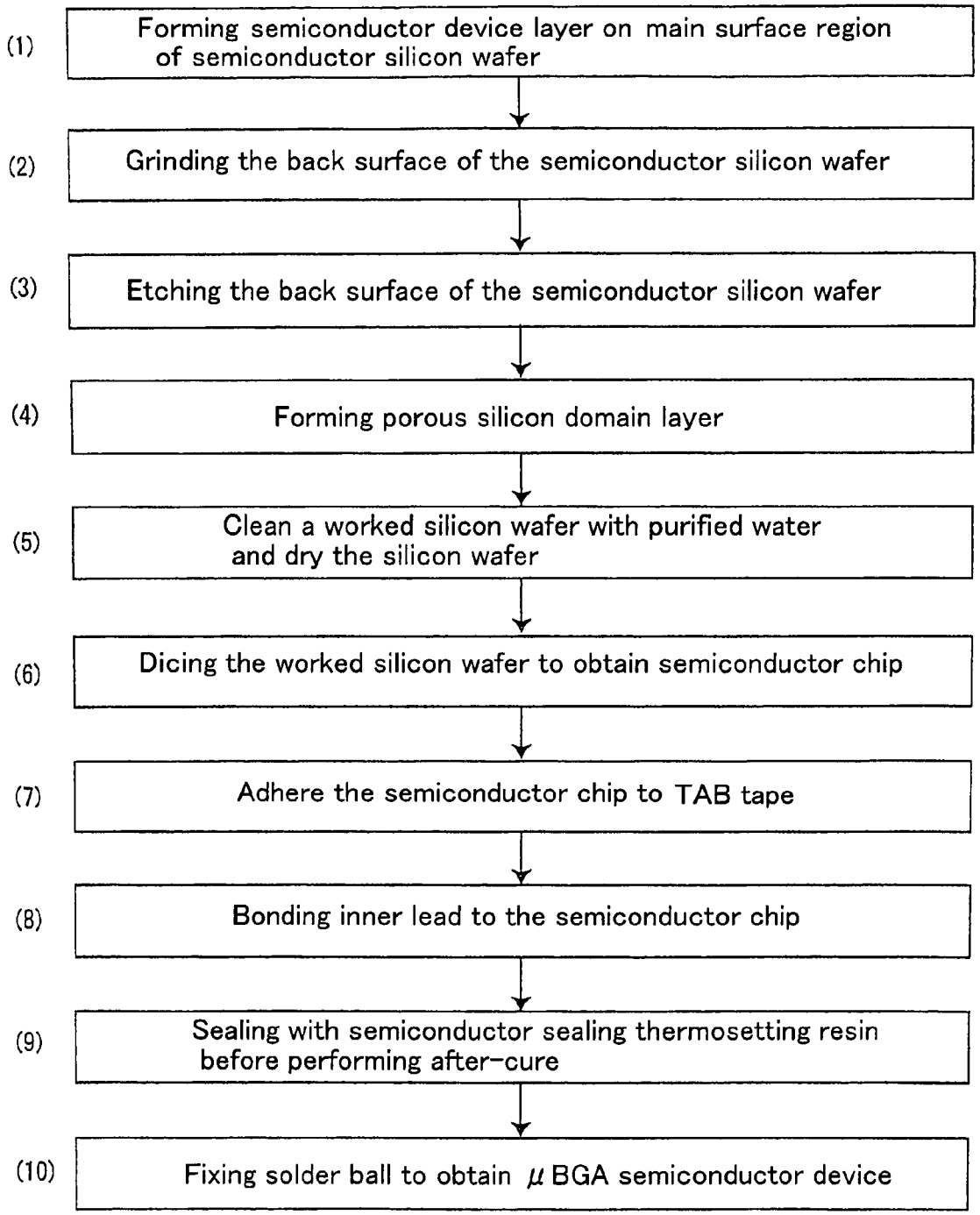
FIG. 24 is a process flow explaining the steps of an example 1.

FIG. 24 is a process flow showing the steps of this example. This process flow was used to carry out the experiment.

Figure 25:
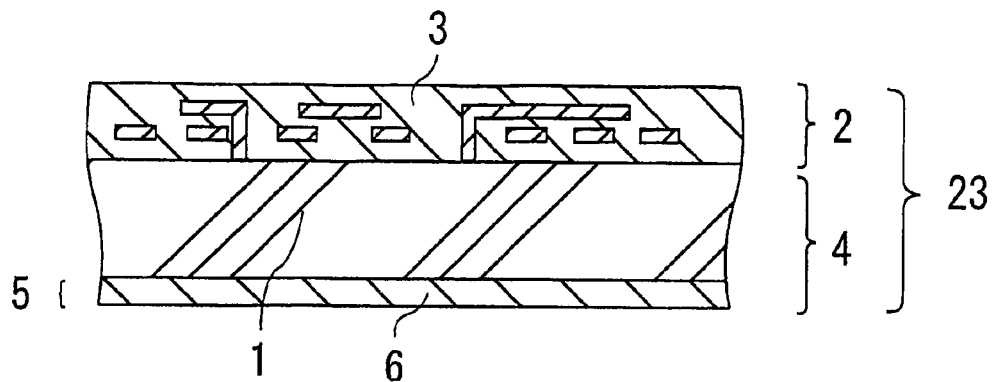
FIG. 25 is a substantial-part cross sectional view schematically illustrating a worked silicon wafer obtained in the example 1.

An epitaxial growth layer containing $1\times10^{15}/cm^3$ of boron was deposited 5 μm on a maternal silicon wafer containing $3\text{-}7\times10^{18}/cm^3$ of boron to prepare a semiconductor silicon wafer 23. Then, as shown in FIG. 25, on the main surface region of the epitaxial growth layer side surface of the semiconductor silicon wafer 23, a semiconductor device layer 3 was provided to serve as a DRAM. Needless to say, the semiconductor device layer 3 was provided with a fundamental configuration to serve as DRAM including a memory cell portion and a peripheral circuit.

After the semiconductor device layer 3 serving as the DRAM was prepared, the back surface of the semiconductor silicon wafer was subjected to rough grinding by using a semiconductor wafer grinding device with a grinding stone of particle size of #400 mesh and the semiconductor silicon wafer was grinded up to the thickness of 160 μm.

Then, the back surface of the semiconductor silicon wafer was subjected to finish grinding by using a semiconductor wafer grinding device with a grinding stone of particle size of #2000 mesh and the semiconductor silicon wafer was grinded up to the thickness of 140 μm.

In the following step, the back surface of the semiconductor silicon wafer was subjected to spin etching for one minute at the etching speed of 40 μm/m by using etchant consisting of mixed liquid of 49% hydrofluoric acid solution and concentrated nitric acid. Then, the back surface of the semiconductor silicon wafer was subjected to spin etching for ten seconds at the etching speed of 10 μm/m by using the etchant consisting of mixed liquid of 49% hydrofluoric acid solution and concentrated nitric. This was followed by cleaning and removing the etchant by purified water. The thickness of the semiconductor silicon wafer at this point was 100 μm.

Next, the semiconductor silicon wafer was kept at the room temperature (23° C.) and the back surface of the semiconductor silicon substrate was held horizontally and sprayed with a vapor from a stain etchant obtained by mixing 49% hydrofluoric acid solution and concentrated nitric acids at a volume ratio of 1 to 10 on the basis of volumes before mixing.

The temperature of the stain etchant was 80° C. and the temperature of the vapor from the stain etchant ranged from 60 to 70° C. Besides, the spray time of the vapor was one minute.

Then, the etchant was cleaned and removed by purified water thereby to obtain a worked silicon wafer 23.

The thus-obtained worked silicon wafer included the porous silicon domain layer having the porous silicon domains 700 illustrated in FIG. 7. The thickness of the porous silicon domain layer was about 200 nm.

The porous silicon domains in the porous silicon domain layer were, as shown in FIG. 2, dispersed like islands at the back surface of the semiconductor silicon substrate. The shape of each of the porous silicon domains was almost circular and the average diameter was several tens of μm.

In addition, the thickness of a portion corresponding to the porous silicon layer 9 in FIG. 7 was a few of nanometers.

Then, the worked silicon wafer was diced into a predetermined shape and thereby a semiconductor chip 104 of the present invention was obtained.

Next description is made about a semiconductor device having the above-described semiconductor chip mounted thereon.

Figure 26:
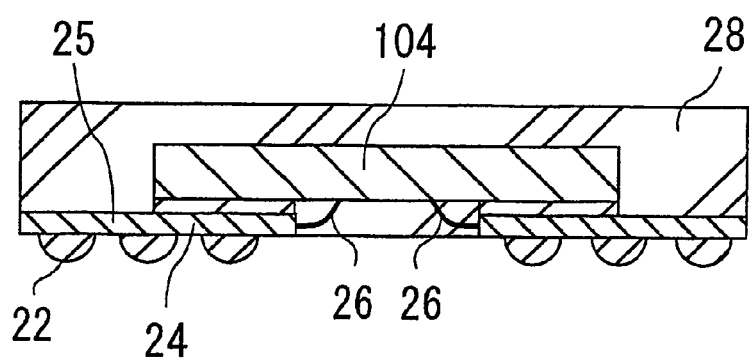
FIG. 26 is a cross sectional view schematically illustrating a μBGA semiconductor device having a semiconductor chip mounted thereon.

FIG. 26 is a cross sectional view schematically illustrating a μBGA semiconductor device with the semiconductor chip mounted thereon.

First, the semiconductor chip 104 was adhered to a TAB tape 25 with use of an adhesive tape 24 and inner leads were bonded thereto. After the semiconductor chip 104 was adhered to the TAB tape 25, baking was conducted at 175° C. for several tens of minutes. Then, a semiconductor sealing thermosetting resin 28 was used to seal the circumferences of the semiconductor chip 104 and the TAB tape 25, which were then subjected to after cure at 175° for 5 hours.

Further, solder balls 27 were fixed to the TAB tape 25 to manufacture the μBGA semiconductor device.

Here, in FIG. 26, the porous silicon domain layer of the semiconductor chip 104 was deposited onto the opposed side to the TAB tape 25.

The thus-obtained μBGA semiconductor device was then subjected to measurement of breakage defects and information holding characteristic defects of the semiconductor chip mounted thereon.

The results are shown in Table 1.

Example 2

In the example 2 the same steps as those in the example 1 were performed except that the step of forming a porous silicon domain layer in the process flow of FIG. 24 was changed as described below.

Specifically, the conditions of spraying with stain etchant in the step of forming a porous silicon domain layer were changed as follows: The temperature of the stain etchant was 50° C., the temperature of the vapor from the stain etchant ranged from 40 to 45° C., and the spray time of the vapor was 3 minutes.

The porous silicon domain layer obtained through this step was then subjected to brush cleaning to remove porous silicon domains from the porous silicon domain layer.

Through this step, a worked silicon wafer was obtained having dimples 12, as illustrated in FIG. 10, dispersed like islands in the back surface of the semiconductor silicon wafer.

Here, the dimples 12 were recessed by about 100 nm relative to the back surface of the semiconductor silicon wafer. Besides, the obtained dimples 12 had an almost circular shape and the average diameter of several of micrometers.

The worked silicon wafer was subjected to almost the same processing as in the example 1 thereby to obtain a semiconductor chip and a μBGA semiconductor device with the semiconductor chip mounted thereon.

The thus-obtained μBGA semiconductor device was then subjected to measurement of breakage defects and information holding characteristic defects of the semiconductor chip mounted thereon.

The results are shown in Table 1.

Example 3

The worked semiconductor silicon wafer, obtained in the example 2, having the dimples 12 dispersed like islands in the back surface of the semiconductor silicon wafer was subjected to stain etching. This resulted in obtaining a worked silicon wafer having a porous silicon layer 9 further formed on the back surface of the silicon wafer as illustrated in FIG. 15.

The dimples-formed surface of the worked silicon wafer obtained in the example 2 was subjected to spin etching for one minute by using hydrofluoric acid solution and nitric base stain etchant while being irradiated with fluorescent lamp light. This resulted in the porous silicon layer formed over the dimple layer. The thickness of the porous silicon layer was 100 μm.

The worked silicon wafer was then subjected to almost the same processing as in the example 1 thereby to obtain a semiconductor chip and a μBGA semiconductor device with the semiconductor chip mounted thereon.

The thus-obtained μBGA semiconductor device was then subjected to measurement of breakage defects and information holding characteristic defects of the semiconductor chip mounted thereon.

The results are shown in Table 1.

Example 4

In the example 1, the ratio of the total area of the porous silicon domains to the back surface of the semiconductor chip 104 was varied to measure a relationship between the total area and breakage defects of the obtained semiconductor chip 104.

Figure 29:
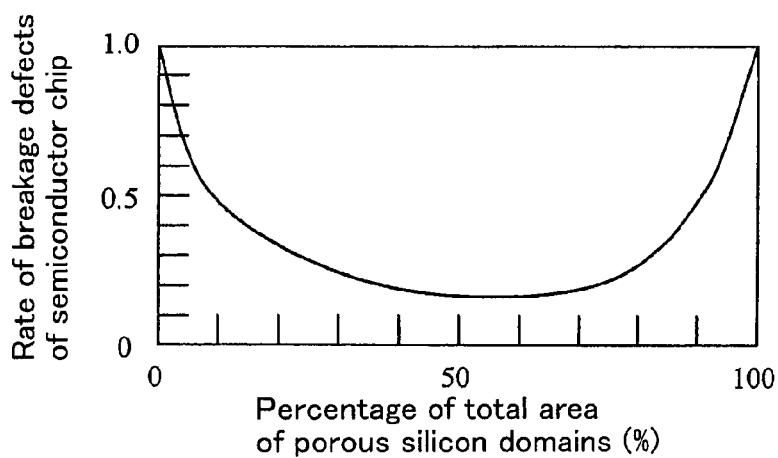
FIG. 29 is a graph showing the relationship between a ratio of the total area of the porous silicon domains to the back surface of the semiconductor silicon substrate and breakage defects of the semiconductor chip.

The results are shown in FIG. 29.

Example 5

In the example 1, the ratio of the average diameter of the porous silicon domains to the back surface of the semiconductor chip 104 was varied to measure a relationship between the total area and breakage defects of the obtained semiconductor chip 104.

Figure 30:
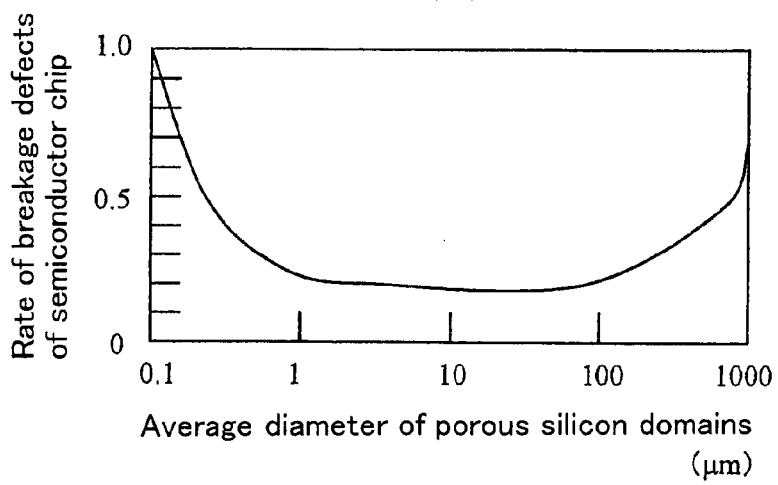
FIG. 30 is a graph showing the relationship between a ratio of the average diameter of the porous silicon domains appearing on the back surface of the semiconductor silicon substrate and breakage defects of the semiconductor chip.
Figure 31:
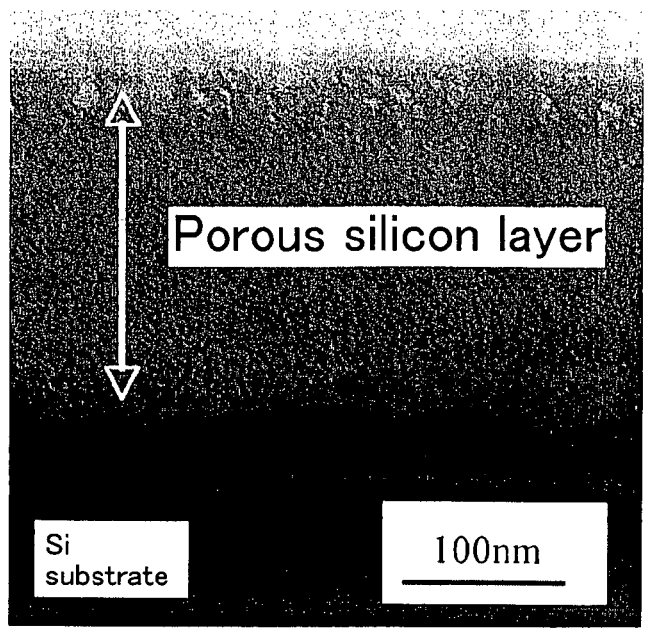
FIG. 31 is a picture of a cross section of a porous silicon layer provided on the p+ semiconductor silicon substrate, taken by an electronic microscope (TEM)
Figure 32:
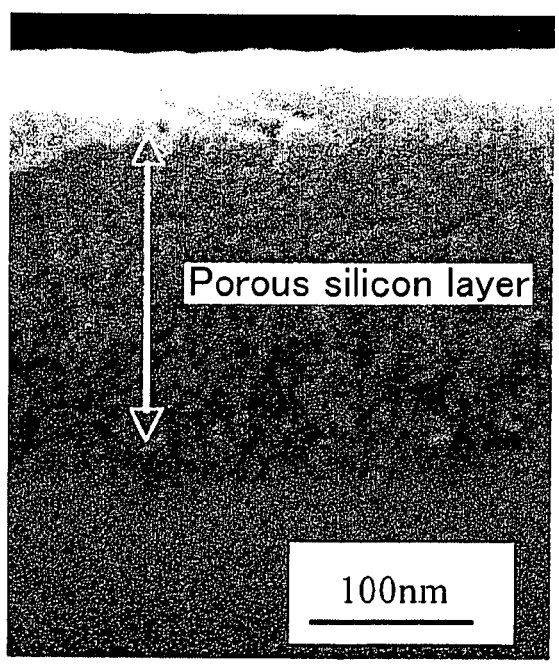
FIG. 32 is a picture of a cross section of a porous silicon layer provided on the p− semiconductor silicon substrate, taken by an electronic microscope (SEM)
Figure 33:
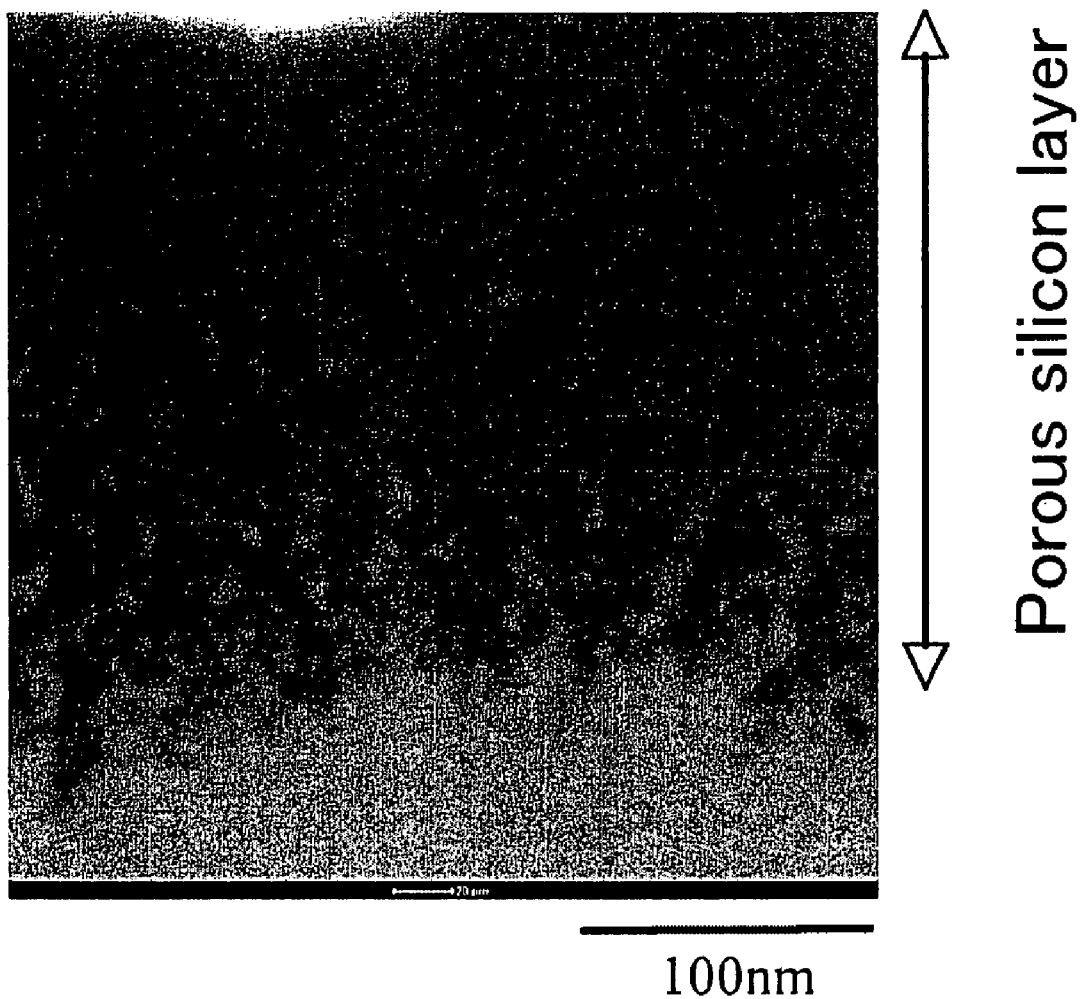
FIG. 33 is a picture of a cross section of a porous silicon layer provided on the p+ semiconductor silicon substrate, taken by an electronic microscope (TEM).

The results are shown in FIG. 30.

COMPARATIVE EXAMPLE 1

Almost the same processing as in the example 1 was performed except that the step of forming a porous silicon domain layer is omitted, and thereby a semiconductor chip and a μBGA semiconductor device with the semiconductor chip mounted thereon was obtained.

The thus-obtained μBGA semiconductor device was then subjected to measurement of breakage defects and information holding characteristic defects of the semiconductor chip mounted thereon.

The results are shown in Table 1.

COMPARATIVE EXAMPLE 2

Almost the same processing as in the example 1 was performed except that the step of forming a porous silicon domain layer is replaced with the step of forming a porous silicon layer on the back surface of the aforementioned semiconductor silicon wafer of thickness 100 μm, and thereby a semiconductor chip and a μBGA semiconductor device with the semiconductor chip mounted thereon was obtained.

Specifically, the dimples-formed surface was subjected to spin etching for one minute by using hydrofluoric acid solution and nitric base stain etchant while being irradiated with fluorescent lamp light. This resulted in the porous silicon layer formed all over the back surface of the aforementioned semiconductor silicon wafer of thickness 100 μm.

The thus-obtained μBGA semiconductor device was then subjected to measurement of breakage defects and information holding characteristic defects of the semiconductor chip mounted thereon.

The results are shown in Table 1.

TABLE 1

|  | Chip breakage defects | information holding characteristic defects |
|---|---|---|
| Example 1 | 0.4 | 0.5 |
| Example 2 | 0.2 | 1.0 |
| Example 3 | 0.2 | 0.5 |
| Comparative example 1 | 1.0 | 1.0 |
| Comparative example 2 | 0.8 | 0.5 |

The present invention is not limited to the above described embodiments, and various variations and modifications may be possible without departing from the scope of the present invention.

This application is based on the Japanese Patent application No. 2005-345056 filed on Nov. 30, 2005, entire content of which is expressly incorporated by reference herein.

What is claimed is:

1. A semiconductor chip including a semiconductor silicon substrate having a semiconductor device layer and a dimple layer,
   said semiconductor device layer being provided in a main surface region on one surface of the semiconductor silicon substrate and including at least one transistor,
   said dimple layer being provided in a main surface region on a back surface which is another surface of the semiconductor silicon substrate, and
   said dimple layer having a plurality of dimples dispersed in the back surface of the semiconductor silicon substrate, and
   said semiconductor chip further comprising a porous silicon layer on the back surface.

2. The semiconductor chip of claim 1, wherein each of the dimples has substantially the same area as a circle having a diameter ranging from 0.2 to 800 μm.

3. The semiconductor chip of claim 1, wherein a total area of the dimples ranges from 10% to 90% of an area of the back surface.

4. A semiconductor device including the semiconductor chip of claim 1.

5. The semiconductor chip of claim 1, wherein the porous silicon layer being formed over substantially entire area of the back surface.

* * * * *